US009853626B2

(12) United States Patent
Burak et al.

(10) Patent No.: US 9,853,626 B2
(45) Date of Patent: Dec. 26, 2017

(54) ACOUSTIC RESONATOR COMPRISING ACOUSTIC REDISTRIBUTION LAYERS AND LATERAL FEATURES

(71) Applicant: Avago Technologies General IP (Singapore) Pte. Ltd., Singapore (SG)

(72) Inventors: Dariusz Burak, Fort Collins, CO (US); Stefan Bader, Fort Collins, CO (US); John Choy, Westminster, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 433 days.

(21) Appl. No.: 14/526,259

(22) Filed: Oct. 28, 2014

(65) Prior Publication Data

US 2015/0280687 A1      Oct. 1, 2015

Related U.S. Application Data

(63) Continuation-in-part of application No. 14/231,325, filed on Mar. 31, 2014.

(51) Int. Cl.
*H03H 9/17* (2006.01)
*H03H 9/13* (2006.01)

(52) U.S. Cl.
CPC ............ *H03H 9/132* (2013.01); *H03H 9/173* (2013.01); *H03H 9/175* (2013.01)

(58) Field of Classification Search
CPC ..................................................... H04R 17/00
USPC ........................... 310/322, 324, 364; 333/187
See application file for complete search history.

(56) References Cited

U.S. PATENT DOCUMENTS

| 5,587,620 | A  | 12/1996 | Ruby et al. |
| 5,873,153 | A  | 2/1999  | Ruby et al. |
| 6,107,721 | A  | 8/2000  | Lakin |
| 6,291,931 | B1 | 9/2001  | Lakin |
| 6,384,697 | B1 | 5/2002  | Ruby |
| 6,507,983 | B1 | 1/2003  | Ruby et al. |
| 6,548,943 | B2 | 4/2003  | Kaitila et al. |

(Continued)

FOREIGN PATENT DOCUMENTS

CN      103001602 A       3/2013
DE      102015108517 A1 * 12/2015 ............... H03H 9/17

OTHER PUBLICATIONS

Co-pending U.S. Appl. No. 13/658,024, filed Oct. 23, 2012.

(Continued)

*Primary Examiner* — Thomas Dougherty

(57) ABSTRACT

An acoustic resonator device including a piezoelectric layer, a first electrode disposed adjacent to a first surface of the piezoelectric layer, and a second electrode disposed adjacent to a second surface of the piezoelectric layer. At least one of the first electrode and the second electrode includes a first conductive layer disposed adjacent to the piezoelectric layer and having a first acoustic impedance, and a second conductive layer disposed on a side of the first conductive layer opposite the piezoelectric layer and having a second acoustic impedance greater than the first acoustic impedance. The acoustic resonator device further includes at least one lateral feature for increasing quality factor Q of the acoustic resonator structure. The at least one lateral feature includes at least one of an air-ring between the piezoelectric layer and the second electrode, and a frame on at least one of the first electrode and the piezoelectric layer.

20 Claims, 22 Drawing Sheets

(56) References Cited

U.S. PATENT DOCUMENTS

| | | |
|---|---|---|
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson, III et al. |
| 7,388,454 B2 | 6/2008 | Ruby et al. |
| 7,612,488 B1 | 11/2009 | Bouche et al. |
| 7,629,865 B2 | 12/2009 | Ruby |
| 8,330,325 B1 | 12/2012 | Burak |
| 8,456,257 B1 | 6/2013 | Fattinger |
| 8,610,333 B2 | 12/2013 | Pang et al. |
| 8,896,395 B2 | 11/2014 | Burak et al. |
| 9,099,983 B2 | 8/2015 | Burak et al. |
| 9,385,684 B2 | 7/2016 | Nikkel et al. |
| 2004/0115881 A1 | 6/2004 | Choi et al. |
| 2006/0255693 A1 | 11/2006 | Nishihara et al. |
| 2007/0205850 A1 | 9/2007 | Jamneala et al. |
| 2008/0258842 A1 | 10/2008 | Ruby et al. |
| 2010/0327697 A1 | 12/2010 | Choy et al. |
| 2010/0327994 A1 | 12/2010 | Choy et al. |
| 2012/0218057 A1 | 8/2012 | Burak et al. |
| 2012/0293278 A1 | 11/2012 | Burak et al. |
| 2013/0063227 A1 | 3/2013 | Burak et al. |
| 2013/0106534 A1 | 5/2013 | Burak et al. |
| 2013/0176086 A1 | 7/2013 | Bradley et al. |
| 2013/0235001 A1 | 9/2013 | Yun et al. |
| 2013/0335169 A1 | 12/2013 | Godshalk et al. |
| 2014/0118088 A1 | 5/2014 | Burak et al. |
| 2014/0118090 A1 | 5/2014 | Grannen et al. |
| 2014/0118091 A1 | 5/2014 | Burak et al. |
| 2014/0125202 A1 | 5/2014 | Choy et al. |
| 2014/0125203 A1 | 5/2014 | Choy et al. |
| 2014/0132117 A1 | 5/2014 | Larson, III |
| 2014/0152152 A1 | 6/2014 | Burak et al. |
| 2014/0159548 A1 | 6/2014 | Burak et al. |
| 2014/0174908 A1 | 6/2014 | Feng et al. |
| 2014/0175950 A1 | 6/2014 | Zou et al. |
| 2014/0176261 A1 | 6/2014 | Burak et al. |
| 2014/0225682 A1 | 8/2014 | Burak et al. |
| 2014/0225683 A1 | 8/2014 | Burak et al. |
| 2014/0232244 A1 | 8/2014 | Sridaran |
| 2014/0232486 A1 | 8/2014 | Burak |
| 2014/0246305 A1 | 9/2014 | Larson, III |
| 2014/0333177 A1* | 11/2014 | Guillou ............... H01L 41/0533 310/321 |

OTHER PUBLICATIONS

Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Fang, et al. "Development of 2.4-GHz film bulk acoustic wave filter for wireless communication", J. Micro/Nanolith. MEMS MOEMS 8 (2), Apr.-Jun. 2009.
Co-pending U.S. Appl. No. 13/662,425, filed Oct. 27, 2012.
Co-pending U.S. Appl. No. 13/662,460, filed Oct. 27, 2012.
Co-pending U.S. Appl. No. 14/192,599, filed Feb. 27, 2014.
Co-pending U.S. Appl. No. 13/781,491, filed Feb. 28, 2013.
Co-pending U.S. Appl. No. 14/231,325, filed Mar. 31, 2014.
Chen, "Fabrication and Characterization of AlN Thin Film Bulk Acoustic Wave Resonator", Dissertation, University of Pittsburgh School of Engineering, 2006.
Martin, et al., "Re-growth of C-Axis Oriented AlN Thin Films", IEEE Ultrasonics Symposium, 2006, 169-172.
Martin, et al., "Shear Mode Coupling and Tilted Gram Growth of AlN Thin Films in BAW Resonators", IEEE Transactions on Ultrasonics, Ferroelectrics, and Frequency Control, vol. 53, No. 7, Jul. 2006, 1339-1343.
Ranjan et al. "Strained Hexagonal ScN: A Material with Unusual Structural and Optical Properties," Physical Review Letters, Jun. 27, 2003, vol. 90, No. 25, The American Physical Society, USA.
Farrer et al., "Properties of hexagonal ScN versus wurtzite GaN and InN," Physical Review B, Nov. 20, 2002, vol. 66, No. 20, The American Physical Society, USA.
Constantin et al., "Composition-dependent structural properties in ScGaN alloy films: A combined experimental and heoretical study," Journal of Applied Physics, Dec. 16, 2005, vol. 98, No. 12, American Institute of Physics, USA.
Akiyama et al., "Enhancement of piezoelectric response in scandium aluminum nitride alloy thin films prepared by dual reactive cosputtering," Advanced Materials, 2009, vol. 21, pp. 593-596, Japan.
Suzuki et al., "Influence of shadowing effect on shear mode acoustic properties in the c-axis tilted AlN films," IEEE Ultrasonics Symposium (IUS), 2010, pp. 1478-1481.
Yanagitani et al., "Giant shear mode electromechanical coupling coefficient k12 in c-axis tilted ScAlN films," IEEE Ultrasonics Symposium (IUS), 2010.
NPL List of Rare Earth Elements, Rare Element Resources [Cited by the Examiner in Office Action dated Jun. 23, 2016 in Co-Pending Application No. 14/161,564. No date provided on document or by the Examiner].
Notice of Allowance from U.S. Appl. No. 14/231,325, dated Sep. 6, 2016.
Chinese Office Action dated Sep. 5, 2017 with English Translation.

* cited by examiner

ACOUSTIC RESONATOR COMPRISING ACOUSTIC REDISTRIBUTION LAYERS AND LATERAL FEATURES

CROSS-REFERENCE TO RELATED APPLICATIONS

This application is a continuation-in-part (CIP) application of application Ser. No. 14/231,325, filed on Mar. 31, 2014 (issued as U.S. Pat. No. 9,548,438 on Jan. 17, 2017), which is hereby incorporated for all purposes.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators, such as thin film bulk acoustic resonators (FBARs), solidly mounted resonators (SMRs), stacked bulk acoustic resonators (SBARs), double bulk acoustic resonators (DBARs), and coupled resonator filters (CRFs).

A typical acoustic resonator comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves (or modes) that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, the performance of an acoustic resonator can be evaluated by the values of its parallel resistance Rp, series resistance Rs, quality (Q) factor, and its electromechanical coupling coefficient $kt^2$. The series resistance Rs is the smallest value of magnitude of input impedance of the acoustic resonator, and series resonance frequency Fs is a frequency at which that minimum occurs. The parallel resistance Rp is the largest value of magnitude of input impedance of the acoustic resonator, and parallel resonance frequency Fp is a frequency at which that maximum occurs. The Q-factor is a parameter that quantifies the amount of energy lost in one cycle of oscillations and is defined as a fraction of energy lost to total energy stored in the resonator in one cycle of oscillations. The electromechanical coupling coefficient $kt^2$ is a normalized difference between parallel and series resonance frequencies Fp and Fs and is typically expressed in percent values (%).

Devices with higher Rp, higher Q-factor and lower Rs are considered to have superior performance compared to devices with lower Rp, lower Q-factor and higher Rs. Thus, other things being equal, it is desirable to provide a filter with an acoustic resonator having a higher Rp, higher Q-factor, and lower Rs. Nevertheless, these performance parameters are typically in a tradeoff relationship with other design factors, such as the cost and size of an acoustic resonator. For instance, in some designs, reducing the size of an acoustic resonator to achieve reduced cost may degrade one or more of the performance parameters. Accordingly, there is a general need for improved resonator designs that achieve improvements such as cost and size scaling without unduly compromising performance.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
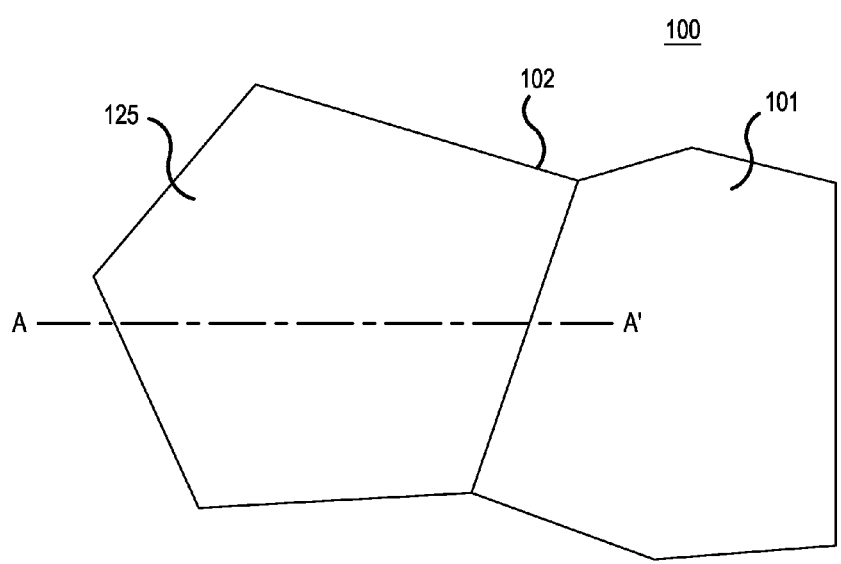
FIG. 1 is a top view of an acoustic resonator including Acoustic Redistribution Layers (ARLs), according to a representative embodiment.
FIG. 1B is a cross-sectional view of the acoustic resonator of FIG. 1A, according to a representative embodiment.
FIG. 1C is a graph illustrating an acoustic impedance profile of an acoustic stack of the acoustic resonator of FIG. 1A.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The described embodiments relate generally to acoustic resonator devices, such as bulk acoustic wave (BAW) resonators, including thin film bulk acoustic wave resonators (FBARs) and solidly mounted resonators (SMRs), although much of the discussion is directed to FBARs for the sake of convenience. Certain details of acoustic resonator devices, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al. (issued as U.S. Pat. No. 9,385,684 on Jul. 5, 2016); U.S. patent application Ser. No. 13/663,449 to Burak et al. (published as U.S. Patent App. Pub. No. 2014/0118091 on May 1, 2024); U.S. patent application Ser. No. 13/660,941 to Burak et al. (published as U.S. Patent App. Pub. No. 2014/0118091 on Apr. 1, 2014); U.S. patent application Ser. No. 13/654,718 to Burak et al. (issued as U.S. Pat. No. 9,099,983 on Aug. 4, 2015); U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

The described embodiments relate generally to acoustic resonators comprising Acoustic Redistribution Layers (ARLs), implemented together with various lateral performance enhancement features (referred to herein as "lateral features"). For example, in certain embodiments, an FBAR comprises a piezoelectric layer disposed between first and second electrodes, wherein at least one of the first and second electrodes comprises multiple layers with respective acoustic impedances that increase with distance from the piezoelectric layer. The use of such acoustic redistribution layers can increase the so called Fractional Frequency Separation (FFS) of the acoustic resonator, which is correlated with Rp and Q-factor. Accordingly, it can be used to create acoustic resonators with increased Rp and Q-factor. In addition, the FBAR may comprise one or more air-bridges and/or one or more frames (e.g., first and second frames), as discussed below, for further increasing Rp and Q-factor, as well as generally suppressing electrically excited piston mode in the frame region, and reflecting and otherwise resonantly suppressing propagating eigenmodes in lateral directions, which improve operation of the acoustic resonator device.

The use of acoustic redistribution layers to increase Rp and Q-factor may allow some acoustic resonators to be manufactured with reduced size, and therefore reduced cost. In general, acoustic resonator is designed to meet a specific characteristic electrical impedance $Z_0$ requirement. The characteristic electrical impedance $Z_0$ is proportional to thickness of the piezoelectric layer and inversely proportional to the resonator area and to the desired frequency of operation. The thickness of the piezoelectric layer is predominantly determined by the desired frequency of operation but also by the desired electromechanical coupling coefficient $kt^2$. Within applicable limits, $kt^2$ is proportional to thickness of the piezoelectric layer and inversely proportional to thicknesses of bottom and top electrodes. More specifically, $kt^2$ is proportional to the fraction of acoustic energy stored in the piezoelectric layer and inversely proportional to the fraction of acoustic energy stored in the electrodes. Thus, for a predetermined $Z_0$ the resonator size, and therefore its cost, may be reduced by using piezoelectric material with higher effective $kt^2$, as it allows to use thinner piezoelectric layer (and therefore reduce its area) at the expense of increasing thicknesses of the electrodes in order to maintain the desired resonance frequency. Thus, an acoustic resonator using a high effective $kt^2$ piezoelectric material (e.g., aluminum scandium nitride (ASN) having, for example, 9% scandium (or less than about 10% scandium) replacing aluminum instead of standard aluminum nitride (AlN)) can be designed to be relatively thin while maintaining desired $kt^2$ of the resonator. Such designs, however, enforce large confinement of acoustic energy into electrodes (typically more than 20%, or so called metal-heavy stacks), which is very unfavorable for FFS (to be discussed in detail below), and therefore for Rp and Q-factor. The use of Acoustic Redistribution Layers allows an increase in FFS for metal-heavy stacks, while preserving series resonance (Fs) and $kt^2$ and only minimally increasing area of the resonator.

Figure 1B:
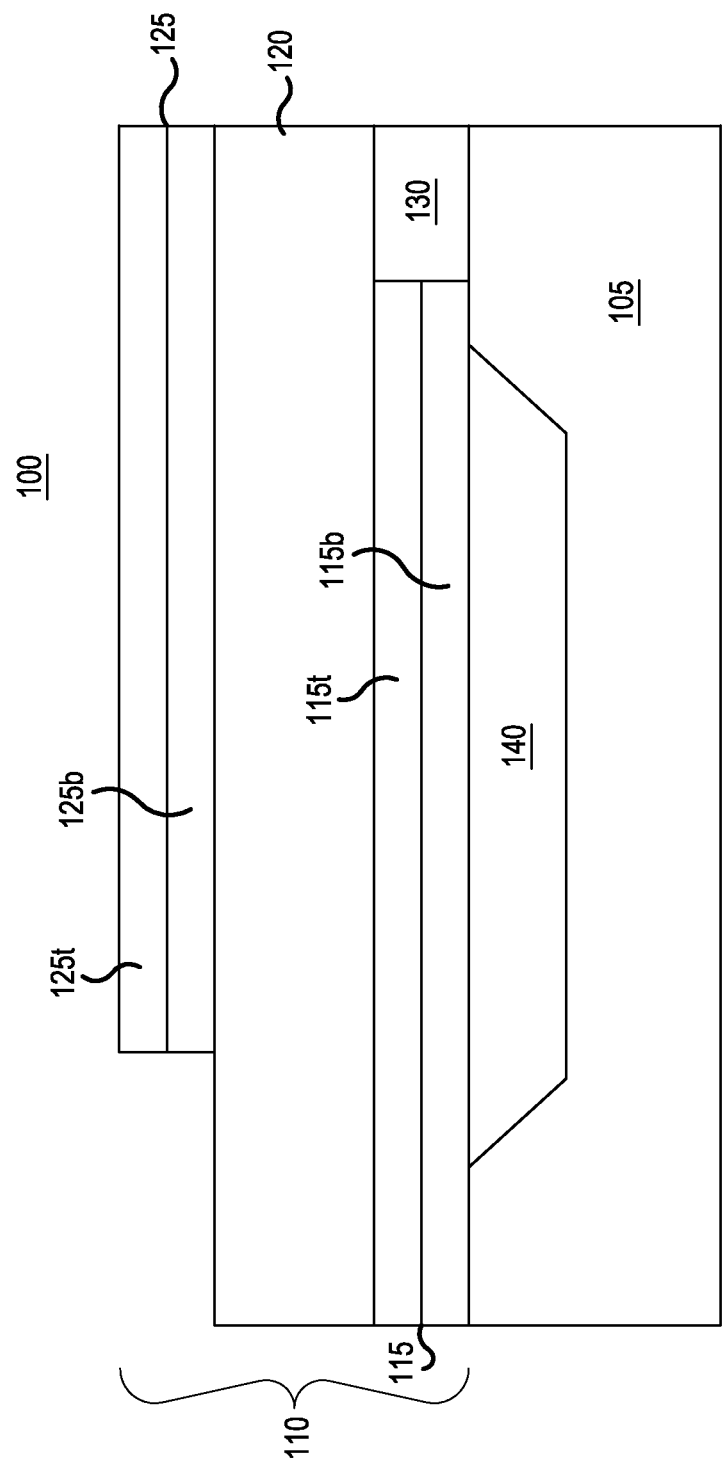
Figure 1C:
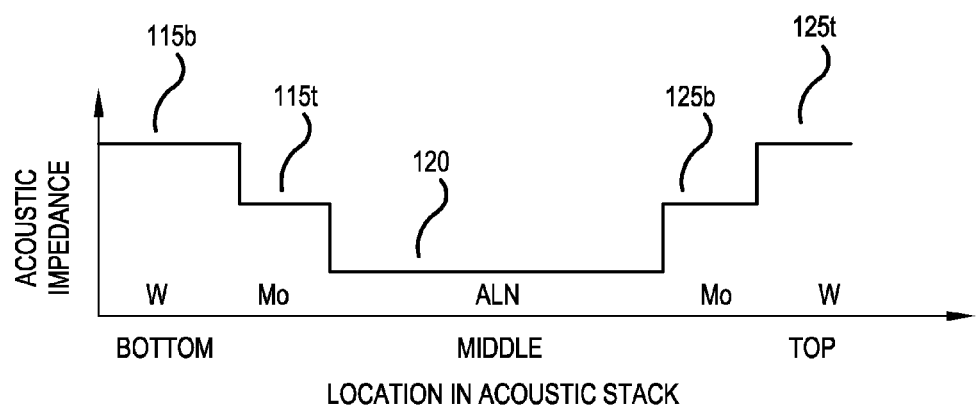

FIG. 1A is a top view of an acoustic resonator 100 according to a representative embodiment, FIG. 1B is a cross-sectional view of acoustic resonator 100 in accordance with a representative embodiment, and FIG. 1C is a graph illustrating an acoustic impedance profile of an acoustic stack of acoustic resonator 100. In the illustrated embodiments, acoustic resonator 100 comprises an FBAR, although it could take another form, such as a solidly mounted resonator (SMR), or a double bulk acoustic resonator (DBAR), for example.

Referring to FIG. 1A, acoustic resonator 100 comprises an acoustic stack having an apodized pentagonal structure, i.e. an asymmetric pentagon, to distribute spurious mode density over frequency and avoid strong excitation of any of spurious modes at any one frequency. In general, acoustic resonator shape is not limited to five sides. For example, common alternative designs include quadrilaterals, hexagons, and other shapes.

Acoustic resonator 100 comprises a top electrode 125 (referred to as a second electrode below), a connection side 101, and an interconnect 102. Connection side 101 is configured to provide an electrical connection to interconnect 102. Interconnect 102 provides electrical signals to top electrode 125 to excite desired acoustic waves in a piezoelectric layer (not shown in FIG. 1A) of acoustic resonator 100.

Referring to FIG. 1B, acoustic resonator 100 comprises a substrate 105 and an acoustic stack 110, in a simplified representation, formed over an acoustic reflector, such as an air cavity or an acoustic mirror, for example.

Substrate 105 can be formed of various types of semiconductor materials compatible with semiconductor processes, such as silicon (Si), gallium arsenide (GaAs), indium phosphide (InP), or the like, which can be useful for integrating connections and electronics, dissipating heat generated from a resonator, thus reducing size and cost and enhancing performance. In the depicted embodiment, the substrate 105 has an air cavity 140 located below acoustic stack 110 to allow free movement of acoustic stack 110 during operation. Air cavity 140 is typically formed by etching substrate 105 and depositing a sacrificial layer therein prior to formation of acoustic stack 110, and then removing the sacrificial layer subsequent to the formation of acoustic stack 110. Various illustrative fabrication techniques for an air cavity in a substrate are described by U.S. Pat. No. 7,345,410 (Mar. 18, 2008), to Grannen et al., which is hereby incorporated by reference in its entirety. As an alternative to air cavity 140, acoustic resonator 100 could include an acoustic reflector such as a distributed Bragg reflector (DBR), for example (in which case the acoustic resonator would be an SMR), with acoustic impedance layers having different acoustic impedances, respectively, as discussed below with reference to FIG. 11.

Acoustic stack 110 comprises a first (bottom) electrode 115, a piezoelectric layer 120 formed on first electrode 115, and second electrode 125 formed on piezoelectric layer 120. More particularly, the first electrode 115 is disposed on the substrate 105 and the air cavity 140, a planarization layer 130 is disposed adjacent to the first electrode 115 on the substrate 105, the piezoelectric layer 120 is disposed on the first electrode 115 and the planarization layer 130, and a second electrode 125 disposed on the piezoelectric layer 620. "Dead-FBAR" region may occur on the right side of the acoustic resonator 100 structure, where the first electrode 115, the piezoelectric layer 120 and the second electrode 125 overlap with the substrate 105. This is a region in which transducer effect occurs, that is, direct excitation of acoustic waves in the substrate 105.

First electrode 115 comprises a bottom conductive layer 115$b$ and a top conductive layer 115$t$. Second electrode 125 comprises a bottom conductive layer 125$b$ and a top conductive layer 125$t$. The conductive layers of first and second electrodes 115 and 125 are formed of materials that have acoustic impedances that increase with their distance from piezoelectric layer 120. For example, bottom conductive layer 115$b$ and top conductive layer 125$t$ may be formed of a material having relatively high acoustic impedance, such as (W) or iridium (Ir) (each of which may be referred to as a second conductive layer formed of second material(s)), while top conductive layer 115$t$ and bottom conductive layer 125$b$ may be formed of a material having relatively low acoustic impedance, such as molybdenum (Mo) or niobium (Nb) (each of which may be referred to as a first conductive layer formed of first material(s)). Various alternative materials that can be used in first and second electrodes 115 and 125 (in addition to or instead of those listed above) include, e.g., aluminum (Al), platinum (Pt), ruthenium (Ru), or hafnium (Hf).

Second electrode 125 may further comprise a passivation layer (not shown), which can be formed of various types of materials, including AlN, silicon carbide (SiC), non-etchable boron-doped silicon glass (NEBSG), silicon dioxide ($SiO_2$), silicon nitride (SiN), polysilicon, and the like. The thickness of the passivation layer should generally be sufficient to protect the layers of acoustic stack 110 from chemical reactions with substances that may enter through a leak in a package.

The planarization layer 130 may be formed of non-etchable boron-doped silicon glass (NEBSG), for example. The planarization layer 130 is not strictly required for the functioning of acoustic resonator 100, but its presence can confer various benefits. For instance, the presence of the planarization layer 130 tends to improve the structural stability of acoustic resonator 100, may improve the quality of growth of subsequent layers, and may allow the first electrode 115 to be formed without its edges extending beyond the cavity 140, if desired. Further examples of potential benefits of planarization are presented in U.S. Patent Application Publication No. 2013/0106534 (published May 2, 2013) to Burak et al., which is hereby incorporated by reference in its entirety.

First and second electrodes 115 and 125 are electrically connected to external circuitry via corresponding contact pads, which are typically formed of a conductive material, such as gold or gold-tin alloy. Although not shown in FIG.

1B, connections between electrodes and the contact pads extend laterally outward from acoustic stack 110. The connections are generally formed of a suitable conductive material, such as titanium (Ti), W, and/or gold (Au).

Piezoelectric layer 120 may be formed of any piezoelectric material compatible with semiconductor processes, such as aluminum nitride (AlN), zinc oxide (ZnO), or zirconate titanate (PZT), for example. Of course, other materials may be incorporated into the above and other features of acoustic resonator 100 (as well as other acoustic resonators described herein) without departing from the scope of the present teachings. Also, in various embodiments, piezoelectric layer 120 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 120. For instance, in various embodiments, the piezoelectric layer 120 may be formed of a thin film piezoelectric comprising $Al_{1-x}Sc_xN$. Examples of doping piezoelectric layers with one or more rare earth elements for improving electromechanical coupling coefficient Kt2 are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. In some embodiments, piezoelectric layer 120 is formed on a seed layer (not shown) disposed over a top surface of first electrode 115. The seed layer can be formed of AlN, for instance, to foster growth of $Al_{1-x}Sc_xN$.

Referring to FIG. 1C, the acoustic impedance of various layer of acoustic stack 110 is shown as a function of vertical location in the stack. The vertical location (i.e., as viewed in FIG. 1B) is represented along the horizontal-axis in FIG. 1C. In the example of FIG. 1C, the example acoustic stack 110 comprises sequentially stacked layers (from bottom to top) of W, Mo, AlN, Mo, and W. The acoustic impedance increases monotonically with distance from piezoelectric layer 120, which tends to distribute acoustic energy across the acoustic stack. In various alternative embodiments, other materials could be used to achieve a similar acoustic impedance profile in which acoustic impedance increases according to distance from piezoelectric layer 120. For instance, the following materials could be used in various combinations to achieve a similar acoustic impedance profile: iridium (Ir), which has an acoustic impedance of about 110 MR (mega-Rayls); tungsten (W), which has an acoustic impedance of about 100 MR; molybdenum (Mo), which has an acoustic impedance of about 65 MR; niobium (Nb), which has an acoustic impedance of about 42 MR; and niobium molybdenum (MoNb) alloys, which have an acoustic impedance of about 42-65 MR depending on a specific composition.

An acoustic redistribution layer (ARL) is a layer of material added to the acoustic stack to change the acoustic energy distribution across the stack. In general, basic electromechanical characteristics of acoustic stacks, such as cutoff-frequencies of various resonances supported by the acoustic stack or electromechanical coupling coefficient $kt_2$ (in a case when piezoelectric material is present in the stack) are determined by weighted parameters (for instance, sound velocity, Poisson ratio and material density) of each single layer, with the weighting factor determined by a fraction of acoustic energy confined in that specific layer. Thus changing the acoustic energy distribution throughout the stack changes the electromechanical characteristics of that stack.

For purely longitudinal motion (such as when the motion is driven by providing a vertical electrical bias for piezoelectric layer), acoustic energy distribution is determined by acoustic impedance of each layer, with low acoustic impedance layers tending to confine more energy. For more general types of motion that include horizontal (or shear) components the acoustic energy distribution across the stack is determined both by acoustic impedance and Poisson ratio of each layer.

For instance, traditional acoustic stack of acoustic resonator 100 shown in FIG. 1A would have only a single metal, such as only W or only Mo, used for first and second electrodes 115 and 125. The metal material selection criteria would be based on specific performance and processing requirements of acoustic resonator 100. For example, because acoustic impedance of W is larger than that of Mo, W would be used to increase $kt^2$ as it may allow confinement of more acoustic energy in the piezoelectric layer 120. As will be discussed in relation to FIG. 4, for some acoustic stacks, for instance designed to meet low $kt^2$ requirements or to minimize the resonator area, a significant fraction of acoustic energy may be confined in first and second electrodes 115 and 125, respectively, comprising W. Such specific energy distribution, while beneficial for minimizing the resonator size, may lead to increased degradation of other important performance characteristics of acoustic resonator 100, such as Rp and Q. Insertion of Mo layers between the first electrode 115 and the piezoelectric layer 120, and between the piezoelectric layer 120 and the second electrode 125 may redistribute part of the energy from the outer W layers to the inner Mo layers, while still keeping the same amount of acoustic energy (and therefore $kt^2$, for instance) confined in piezoelectric layer 120. Thus Mo layer would form acoustic redistribution layer for the original stack of acoustic resonator 100 comprising pure W electrodes. In practical situations, an ALR layer may replace part of the original metal layer comprising the first and second electrodes 115 and 125, respectively, and the piezoelectric layer 120 thickness may need to be adjusted in order to match the original series and parallel resonance frequencies Fs and Fp, respectively. An example of acoustic impedance distribution in an acoustic stack with an ARL formed of Mo is shown schematically in FIG. 1C as layers 115$t$ and 125$b$, while the remaining portions of original W electrodes are shown as layers 115$b$ and 125$t$.

Figure 2:
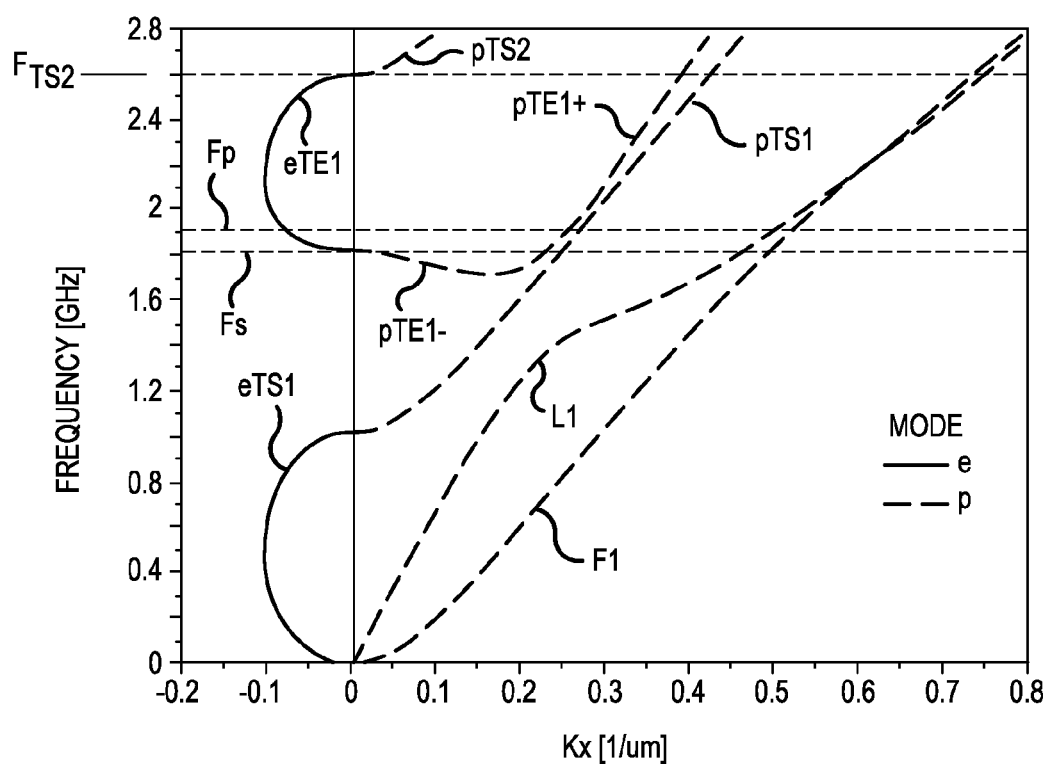
FIG. 2 is an acoustic dispersion diagram illustrating simulated vibrational modes of an acoustic resonator at different frequencies.

FIG. 2 is an acoustic dispersion diagram illustrating simulated vibrational modes of an acoustic resonator at different frequencies. This diagram was generated with respect to a variation of acoustic resonator 100 in which first and second electrodes 115 and 125 are each formed entirely of Mo. In other words, the curves in FIG. 2 represent the performance of acoustic resonator 100 in the absence of acoustic redistribution layers (ALRs). In the simulated device, first and second electrodes 115 and 125 each have a thickness of approximately 4200 Å, and piezoelectric layer 120 comprises AN with a thickness of approximately 10000 Å. In this configuration approximately 80% of the acoustic energy is confined in piezoelectric layer 120 during operation of acoustic resonator 100.

In FIG. 2, the horizontal axis corresponds to the lateral wave-number Kx, with positive numbers indicating real Kx values and negative numbers indicating imaginary Kx values. Each point in FIG. 2 corresponds to an eigen-mode of specific acoustic polarization and direction of propagation supported by the acoustic stack. Real Kx values (illustrated by solid curves) indicate that a given mode is a propagating one (e.g., it may propagate in a periodic fashion from a point of excitation) while imaginary Kx values (illustrated by dashed curves) indicate that a given mode is an evanescent one (e.g., it may decay exponentially from a point of excitation). The sign convention for evanescent (negative sign) and propagating (positive sign) eigen-modes is purely a matter of convenience of the presentation. The propagating equations for acoustic waves in various regions of the reference BAW resonator device and the acoustic resonator 100 admit both signs for each eigen-mode solution and the actual selection of the wave-number sign is determined by the appropriate boundary conditions.

The modes illustrated in FIG. 2 include the following: dilatational (L1), flexural (F1), evanescent thickness shear (eTS1), propagating thickness shear (pTS1), propagating thickness extensional with negative group velocity dispersion (pTE1−), propagating thickness extensional with positive group velocity dispersion (pTE1+), evanescent thickness extensional (eTE1), and propagating thickness shear of second order (pTS2). Note that the notation used here does not follow the standard separation of modes into symmetric and anti-symmetric classes because the acoustic stacks comprising acoustic resonator 100 may be significantly more complicated than single layers for which such classification is valid. So called complex evanescent modes are not shown in FIG. 2 for simplicity of a presentation. Complex evanescent modes propagate in a periodic fashion from a point of excitation, but their amplitude of the oscillations decays exponentially. Generally, these modes are very short range, meaning that they decay within about 0.1 μm–about 2 μm from the excitation point and usually do not contribute to radiative energy loss.

Series (Fs), parallel (Fp) and second-order shear ($F_{TS2}$) resonance frequencies are shown as dashed horizontal lines. Fractional Frequency Separation can be expressed mathematically by the following equation (1).

$$\text{FFS}=100*(F_{TS2}\text{-}F_S)/F_S \text{ [\%]} \quad (1)$$

The significance of FFS in minimization of radiative losses at parallel resonance frequency Fp and maximization of Rp will be discussed in detail in relation to FIG. 3, and it relies on an overlap (or degree of similarity) between Mason pseudo-mode and eTE1 eigen-mode throughout the acoustic stack. The Mason pseudo-mode is a specific distribution of longitudinal Uz displacement throughout the acoustic stack of acoustic resonator 100 produced by vertical voltage applied between first and second electrodes 115 and 125, respectively. On the dispersion diagram shown in FIG. 2 the Mason pseudo-mode may be represented as a vertical line at Kx=0, which corresponds to spatially uniform distribution of Uz in a lateral direction of acoustic resonator 100—for that reason the Mason pseudo-mode may be also referred to as a piston mode. Note that Mason pseudo-mode does not have any shear Ux displacement component at any frequency of operation, and is $1^{st}$ order thickness extensional mode around Fs meaning that longitudinal Uz displacement has one null close to the center of the stack while the bottom and top of the stack are displaced in the opposite direction with respect to their initial (that is without applied voltage) position. On the other hand, pTE1−, eTE1 and pTS2 modes belong to a family of $1^{st}$ order thickness extensional and $2^{nd}$ order thickness shear mode, meaning that longitudinal Uz displacement has one null close to the center of the stack (similarly to the Mason pseudo-mode) and shear Ux displacement has two nulls inside the stack. As frequency changes from below Fs to above $F_{TS2}$ in FIG. 2 the dominant polarization of the mode represented by pTE1−, eTE1 and pTS2 branches continuously changes from predominantly longitudinal around Fs frequency to predominantly shear around $F_{TS2}$ frequency, and at the same time the mode order continuously changes from predominantly $1^{st}$ order around Fs frequency to predominantly $2^{nd}$ order around $F_{TS2}$ frequency. In particular, at Fp the eTE1 eigen-mode is a mixed longitudinal/shear and $1^{st}/2^{nd}$ order mode, with the specific partitioning of energy between Uz and Ux components depending on frequency separation between $F_{TS2}$ and Fs, and between Fp and Fs, Since for most of the acoustic stacks Fp is relatively close to Fs as compared to $F_{TS2}$, FFS can be used as a simple measure of modal similarity between eTE1 eigen-mode and Mason pseudo-mode. Note that for frequency F in a very close proximity to Fs (F-Fs <<Fp-Fs) the Mason pseudo-mode and eTE1 eigen-mode are practically identical.

Figure 3A:
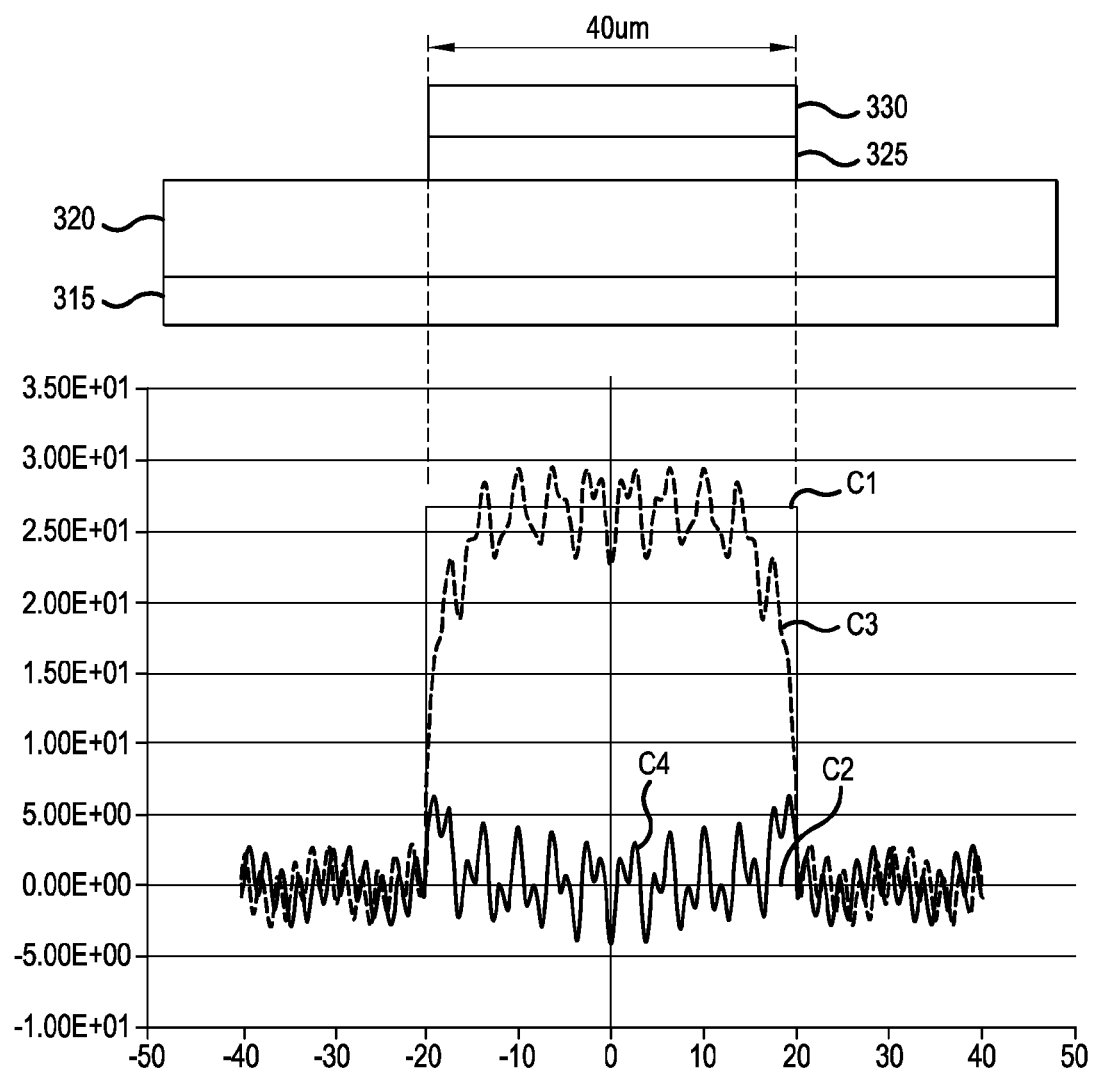
FIG. 3A is a graph illustrating longitudinal (Uz) displacements of an acoustic resonator operating at parallel resonance frequency Fp.
Figure 3B:
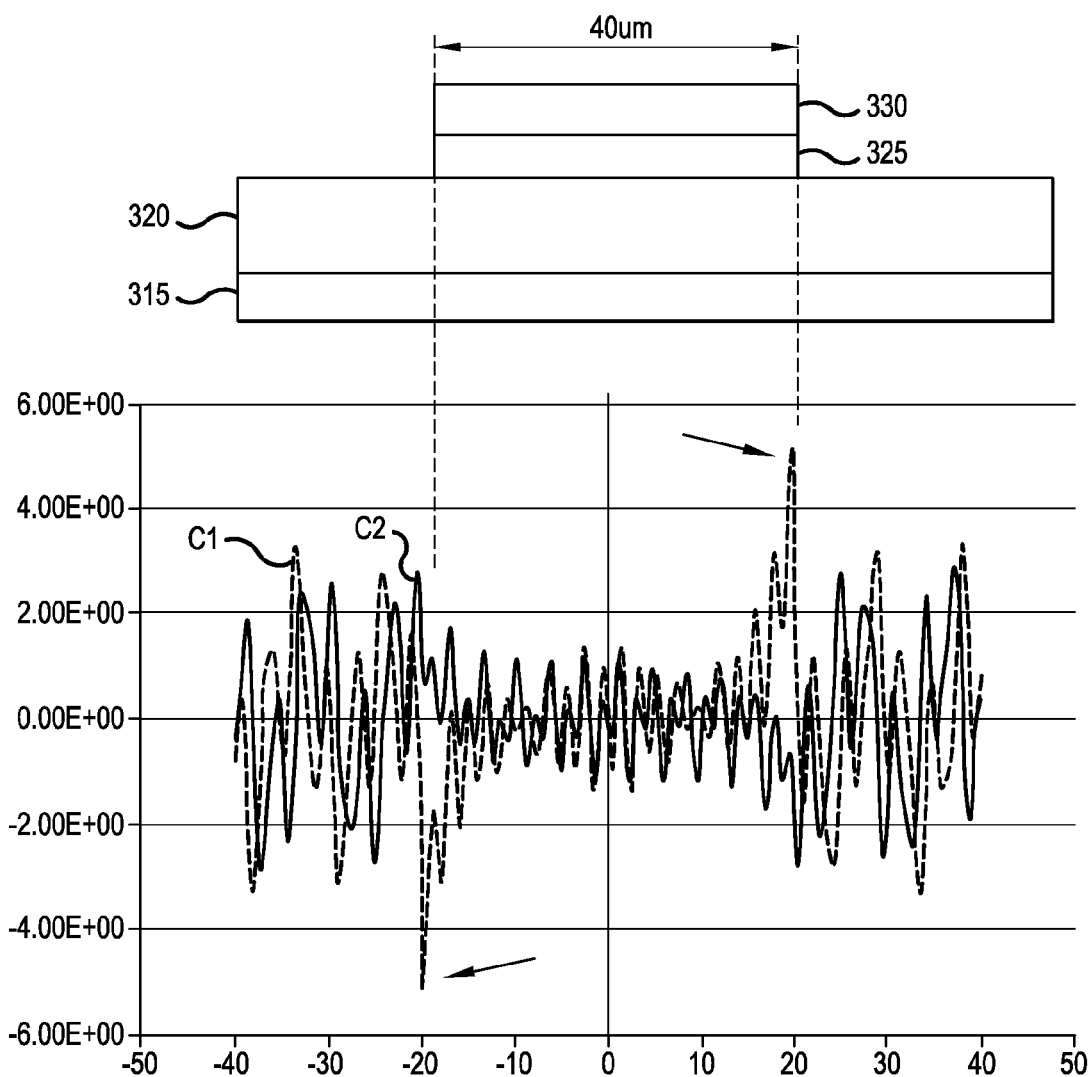
FIG. 3B is a graph illustrating shear (Ux) displacements of an acoustic resonator operating at parallel resonance frequency Fp.

FIGS. 3A and 3B are graphs illustrating longitudinal (Uz) and shear (Ux) displacements, respectively, of an acoustic resonator operating at parallel resonance frequency Fp. The horizontal axis corresponds to lateral location inside the resonator and is shown in micrometers (um). The longitudinal Uz and shear Ux displacements were simulated using the mode-matching method with respect to a 40 um wide FBAR as shown in the drawings. The simulated stack has the first electrode 315 formed of Mo with approximate thickness of 3800 Å, the piezoelectric layer 320 formed of AlN with approximate thickness of 9300 Å, the second electrode 325 formed of Mo with approximate thickness of 3250 Å and the passivation layer 330 formed of AlN with approximate thickness of 2000 Å. The illustrated displacements have been computed at approximately 1200 Å above the interface between the first electrode 315 and the piezoelectric layer 320. The illustrated FBAR has a computed Rp of approximately 1500 ohms. Its active region (inside the dotted lines) has Fs of approximately 2.03 GHz, $kt^2$ of approximately 5.8%, and FFS of approximately 42%. Its field region (outside the dotted lines) has Fs of approximately 3.38 GHz, $kt^2$ of approximately 4.6%, and FFS of approximately 20%. The applied voltage to the top electrode 325 was 1V (with first electrode 315 electrically grounded), and the Uz and Ux displacements are shown in picometers (pm).

FIG. 3A shows real (curve C1) and imaginary (curve C2) parts of Mason pseudo-mode displacements, and real (curve C3) and imaginary (curve C4) parts of total displacements. FIG. 3B shows only the real (curve C1) and imaginary (curve C2) parts of total displacements because the Mason pseudo-mode does not support any non-zero shear displacement component.

For the illustrated FBAR at simulated at parallel resonance frequency Fp, the Uz displacement for Mason pseudo-mode (curve Clin FIG. 3A) is flat across the electrode and is terminated abruptly at the edges of the top electrode indicated by vertical dashed lines. As mentioned above, the cutoff frequency for the thickness extensional TE1 resonance in the field region is approximately 1.3 GHz higher than in the active region (where Fs is approximately 2.03 GHz), which essentially clamps the total displacement outside of the active region. That clamping requirement enforces (through appropriate stress and particle velocity continuity conditions) suppression of total motion at the edge of the top electrode, which may be accomplished primary by mechanical excitation of eTE1 mode in the opposite phase to the Mason pseudo-mode (driven by electric field). As a result, total Uz displacement exhibits evanescent decay towards the electrode edges (at +/−20 um), as illustrated in FIG. 3A. However, eTE1 mode may not completely suppress total Uz displacement (curves C3 and C4 in FIG. 3A) at the edges of the top electrode because it also contains a non-zero shear Ux displacement. Since Mason pseudo-mode is purely longitudinal, the total shear component of total displacement at the edge of the top electrode may occur with amplitude that is predominantly equal to shear Ux component amplitude of eTE1 mode at the top electrode edges, as illustrated with curves C1 and C2 in FIG. 3B. The arrows in FIG. 3B point to the top electrode edges where total Ux displacement reaches maximum values. Therefore, incomplete suppression of Mason's pseudo-mode longitudinal Uz displacement component and enhanced excitation of eTE1 eigen-mode's shear Ux displacement component at the top electrode edges require excitation of other propagating and complex eigen-modes to facilitate the necessary stress and particle velocity continuity conditions at the top electrode edge. These propagating modes in the active region (pTE1, pTS1, L1 and F1) are evidenced by additional higher spatial frequency displacements superimposed on evanescent and flat portions of total longitudinal Uz and shear Ux displacements illustrated in FIGS. 3A and 3B, respectively. The propagating modes in the field region (pTS1, L1 and F1) are evidenced by periodic total longitudinal Uz and shear Ux displacements illustrated in FIGS. 3A and 3B, respectively. Propagating, evanescent and complex modes excited in the main active region lead to enhanced localized viscous loss and to the ohmic loss due to Joule heating provided a given mode contains thickness extensional component. Propagating modes in the field region lead to acoustic radiation of energy to surrounding areas. All three loss mechanisms (radiative, viscous and ohmic) degrade resonator performance, and in particular lower resonator's parallel resistance Rp and quality factor Q.

As noted above, a predominant reason for enhanced acoustic loss at parallel resonance frequency Fp is inability to completely suppress electrically excited longitudinal displacements of the Mason pseudo-mode with evanescent eTE1 eigen-mode due to the presence of non-zero shear component of the eTE1 eigen-mode. However, as noted in relation to FIG. 2, the amount of shear component in eTE1 eigen-mode is predominantly determined by FFS, that is by the separation of $2^{nd}$ order shear cut-off frequency $F_{TS2}$ from the series resonance frequency Fs. Thus, by redesigning the acoustic stack to increase FFS one may reduce the shear component in eTE1 eigen-mode, facilitate more efficient suppression of total motion at the edge of the top electrode, and therefore increase Rp and Q-factor. As will be shown in relation to FIG. 4, for metal-heavy stacks such stack redesign is possible with Acoustic Redistribution Layers.

Figure 4:
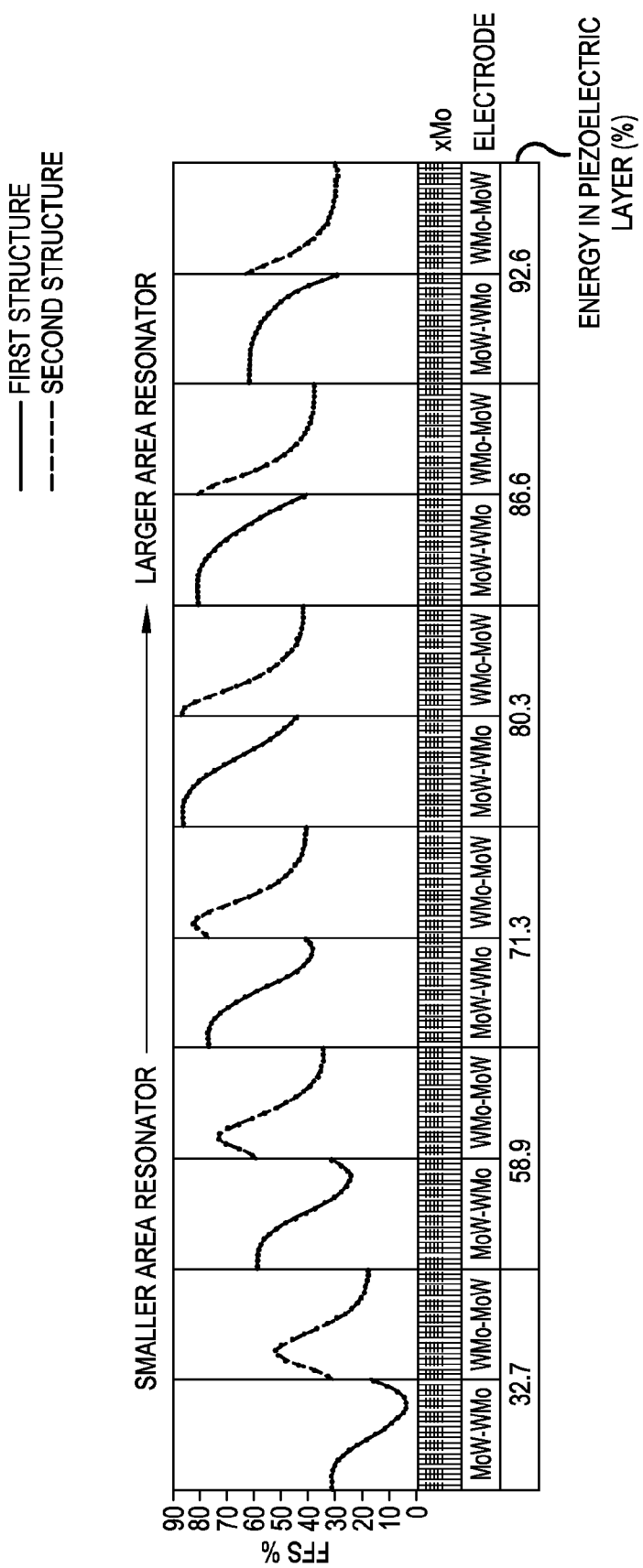
FIG. 4 is a graph illustrating fractional frequency separation (FFS) as a function of stack design, according to various representative embodiments.

FIG. 4 is a graph illustrating FFS as a function of stack design, according to various representative embodiments. In sub-graphs shown in FIG. 4, solid curves represent FFS of acoustic resonators having a first structure, and dashed curves represent the FFS of acoustic resonators having a second structure. The first structure corresponds to a variation of acoustic resonator 100 in which piezoelectric layer 120 is formed of ASN, and each of first and second electrodes 115 and 125 is formed of a layer of W adjacent to piezoelectric layer 120 and a layer of Mo adjacent to the layer of W (labeled "MoW-WMo"). The second structure is the same as the first structure, except that the locations of the layers of Mo and W are switched in each of the first and second electrodes 115 and 125 (labeled "WMo-MoW"). Each resonator shown if FIG. 4 has the same series resonance frequency Fs. However, each sub-graph corresponds to resonators having different fraction of total acoustic energy confined in the piezoelectric layer as indicated by the most outer horizontal axis. Stated differently, each sub-graph corresponds to resonators having different $kt^2$, where small fraction of acoustic energy confined in the piezoelectric layer corresponds to low $kt^2$, and large fraction of acoustic energy confined in the piezoelectric layer corresponds to high $kt^2$.

The graph was generated for simulated acoustic resonators having different cross-sectional areas (e.g., an area as shown in FIG. 1B) and different fractions of Mo in total electrode thickness. The acoustic resonators cross-sectional areas vary from small to large as viewed in FIG. 4. The different fractions of Mo are indicated by the label "xMo", which is defined by the following equation (2).

$$xMo=tMo/(tMo+tW) \qquad (2)$$

In equation (2), tMo corresponds to the thickness of each layer of Mo, and tW represents the thickness of each layer of W. Thus, xMo corresponds to a thickness of Mo layer normalized by the total electrode thickness. In each sub-graph, xMo ranges from 0 (on the left side) to 1 (on the right side) in steps of 0.05. Moreover, perfectly symmetric stacks were assumed, meaning that fraction and location of Mo with respect to piezoelectric layer in bottom and top electrode is identical. For example, xMo=0.1 for "WMo-MoW" design indicates that Mo layer comprises 10% of the total electrode thickness-wise for each of bottom and top electrodes, and Mo layers are located next to the piezoelectric layer. For another example, xMo=0.1 for "MoW-WMo" design indicates that Mo layer comprises 10% of the total electrode thickness-wise for each of bottom and top electrodes, and W layers are located next to the piezoelectric layer.

As illustrated in FIG. 4, the maximum FFS is the largest for stacks having approximately 80% of energy confined in the piezoelectric layer. For those stacks, FFS is approximately 50% for pure-Mo electrodes and approximately 90% for pure-W electrodes. Thus, for designs where approximately 80% of energy is confined in piezoelectric layer it may be beneficial to use high acoustic impedance electrodes (like W or Ir as opposed to Mo or Nb, for instance) to increase FFS and therefore Rp and Q of the resonator. Generally, $2^{nd}$ order shear resonance $F_{TS2}$ (and therefore FFS, for fixed Fs) is determined by specific distribution of energy at TS2 resonance throughout the stack. Numerical simulations indicate that for resonators with single metal electrodes (e.g., only W or only Mo) maximum FFS design correspond to a stack for which fraction of eigen-modal energy at TS2 resonance is approximately equally distributed between piezoelectric and metal layers. Thus, for either pure Mo (xMo=1) or pure W (xMo=0) designs shown in FIG. 4 the maximum FFS point (approximately 80% of Mason's pseudo-mode acoustic energy confined in piezoelectric layer at Fp) corresponds to a design for which TS2 eigen-mode energy peaks at $F_{TS2}$ are located approximately at the interface between piezoelectric and metal layers. For metal-heavy designs (that is less than approximately 80% of Mason's pseudo-mode acoustic energy is confined in piezoelectric layer at Fp) the TS2 eigen-mode energy peaks at $F_{TS2}$ are located inside the metal layers, and for metal-light designs (that is more than approximately 80% of Mason's pseudo-mode acoustic energy is confined in piezoelectric layer at Fp) the TS2 eigen-mode energy peaks at $F_{TS2}$ are located inside the piezoelectric layer. However, the Poisson ratios of piezoelectric and metal layers also play a significant role in determining pseudo-mode energy distributions at $F_{TS2}$, and therefore FFS for any specific stack.

In general, the fraction of energy in the piezoelectric layer determines the $kt^2$ of the acoustic resonator. Acoustic resonators with large $kt^2$ typically have thick piezoelectric layer, thin electrode layers, and large fraction of energy confined in the piezoelectric layer (e.g. over 90%). However, with a thick piezoelectric layer, a relatively large cross-sectional area is needed to match the required resonators impedance, e.g., to Zo=50 ohms yielding unfavorable increase of the device cost.

The cost of an acoustic resonator is generally proportional to its cross-sectional area, so other things being equal, it is usually desirable to minimize the cross-sectional area. To minimize the cross-sectional area, the piezoelectric layer may be formed of a material having intrinsically high $kt^2$ (e.g., ASN with 9% scandium), allowing the piezoelectric layer to be relatively thin while maintaining adequate $kt^2$. In such an acoustic resonator, a relatively high amount of energy may be confined in electrode layers, e.g. 70% in the electrode layers and 30% in the piezoelectric layer, as illustrated by a sub-graph at the far left of FIG. 4. This unfortunately leads to severe degradation of FFS, e.g., to approximately 20% for Mo (xMo=1) and to approximately 30% for pure W (xMo=0). However, the use of acoustic redistribution layers ("WMo-MoW" electrodes, with Mo layer redistributing acoustic energy from W layer) can increase FFS to approximately 50% for small resonators by using WMo-MoW electrodes, as illustrated by a sub-graph second from left in FIG. 4. Numerical simulations indicate that the maximum FFS design in the presence of acoustic redistribution layer formed of Mo corresponds to the peak of TS2 eigen-mode at $F_{TS2}$ resonance being located approximately at the interface between Mo and W layers. Thus, specific design of optimal ARL may depend on acoustic impedance and Poisson ratios of materials used in a specific stack. As indicated above and demonstrated below in relation to FIG. 5, beneficial increase in FFS corresponds to an increase in Rp, and therefore the increase in FFS corresponds to improved acoustic resonator performance.

Figure 5:
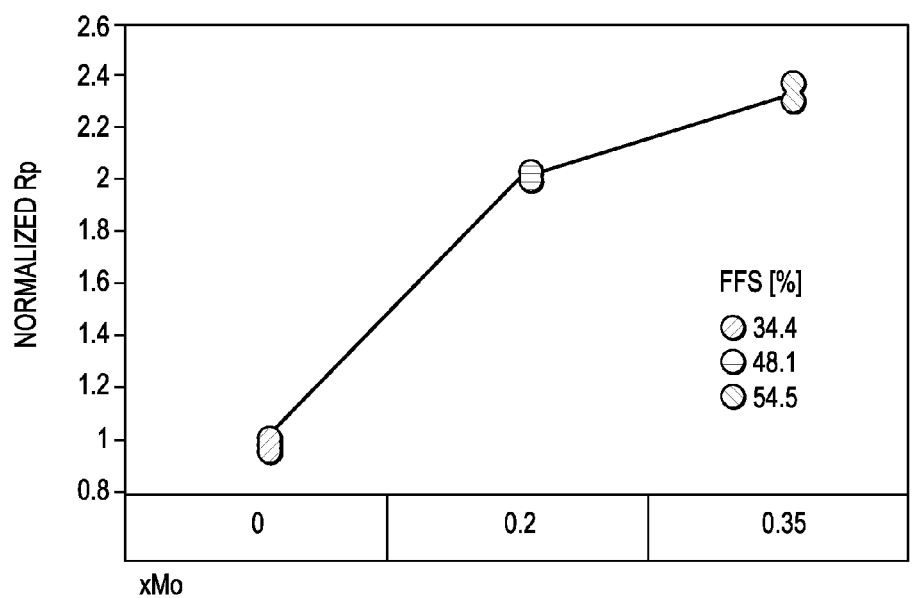
FIG. 5 is a graph illustrating the normalized Rp of the acoustic resonator shown in FIG. 1B as a function of the normalized thickness of a layer of molybdenum.

FIG. 5 is a graph illustrating the measured normalized Rp of acoustic resonator 100 shown in FIG. 1B as a function of xMo. In FIG. 5, normalized Rp is plotted for xMo=0, which corresponds to acoustic resonator 100 with tungsten-only electrodes, and for xMo=0.2 and xMo=0.35 corresponding to acoustic resonator 100 with approximately 20% and 35% of W being replaced with Mo. The normalized Rp has been obtained by diving the best achievable Rp for each of the stacks by the best achievable Rp for pure-W stack (that is a stack with xMo=0). For all measured stack the piezoelectric layer 120 is formed of ASN having a scandium concentration of 9%.

The use of ASN, which has relatively high intrinsic $kt^2$, allows the acoustic resonators to be formed with a relatively thin piezoelectric layer (i.e., small cross-sectional area) while maintaining adequate $kt^2$ for certain applications, such as RF filters for low-bands (e.g. Band 13, 17, 20, etc). However, it also requires these resonators to use metal-heavy stacks in which less than 80% of energy is confined in the piezoelectric layer. As a result, FFS tends to decrease, as shown in FIG. 4, and the stacks may yield poor Rp.

As illustrated in FIG. 5, the use of acoustic redistribution layers (replacing some of W next to 9%-ASN with Mo, as indicated by xMo) increases FFS from approximately 35% for the design with xMo=0 to approximately 55% with xMo=0.35, and it increases Rp by approximately 2 times for xMo=0.2 design and by approximately 2.4 times for xMo=0.35. As a result, significant area and cost savings are possible with Acoustic Redistribution Layers without a penalty to device performance.

As mentioned above, various additional embodiments include at least one lateral feature to further enhance performance of acoustic resonators (e.g., acoustic resonator 100) with top and/or bottom electrodes having an ALR. Examples of lateral features include frames and air-rings (comprising air-bridges and/or air-wings). Generally, an overlap among the top electrode, the piezoelectric layer and the bottom electrode over an acoustic reflecting feature (e.g., an air cavity or an acoustic reflector, such as a DBR) defines a main membrane region. One or more frames may be formed on the top electrode, on the piezoelectric layer (between the piezoelectric layer and the top electrode), on the bottom electrode (between the bottom electrode and the piezoelectric layer, and/or below the bottom electrode, defining an active region within the main membrane region. That is, an inner edge of the frame extending furthest into the main membrane region defines an outer boundary of the active region. In addition, one or more air-rings may be formed outside an outer boundary of the main membrane region. The air-ring(s) may be formed between the piezoelectric layer and the top electrode and/or between the bottom electrode and the piezoelectric layer. When an air-ring is formed between the piezoelectric layer and the top electrode, it comprises an air-bridge on the connection side of the top electrode and an air-wing along the remaining outside perimeter.

A frame may be formed by adding a layer of material, usually an electrically conducting material (although dielectric material is possible as well), to the top electrode and/or the bottom electrode. The frame may be an add-on frame. An add-on frame may be formed by depositing the material above or below of a layer forming either the top or bottom electrode along a perimeter of the active region. A region of the acoustic resonator above and below the frame (and bordered by an air-ring) may be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the active region. A frame that lowers the cutoff frequency in the frame region as compared to the active region may be referred to as a Low Velocity Frame (LVF), while a frame that increases the cutoff frequency in the frame region as compared to the main active region may be referred to as a High Velocity Frame (HVF). The reasoning behind this nomenclature is that for composite frames (for which thicknesses of the frame and active regions are substantially the same), an increase or decrease of the cutoff frequency is substantially equivalent to an increase or decrease an effective sound velocity of the acoustic stack forming the frame, respectively.

An add-on frame with lower effective sound velocity than the corresponding effective sound velocity of the active region (i.e., an LVF) generally increases parallel resistance Rp and Q-factor of the acoustic resonator above the cutoff frequency of the active region. Conversely, an add-on frame with a higher effective sound velocity than the corresponding effective sound velocity of the active region (i.e., an HVF) generally decreases series resistance Rs and increases Q-factor of the acoustic resonator below the cutoff frequency of the main active region. A typical low velocity frame, for example, effectively provides a region with significantly lower cutoff frequency than the active region and therefore suppresses the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at active/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of frames, as well as related materials and operating characteristics, are described in the above cited U.S. patent application Ser. Nos. 13/663,449 and 13/660,941 to Burak et al. As explained in those applications, frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or electromechanical coupling coefficient $kt^2$. Although the following description presents several embodiments in the form of FBAR devices, several of the described concepts could be implemented in other forms of acoustic resonators, such as SMRs, for example.

Figure 9A:
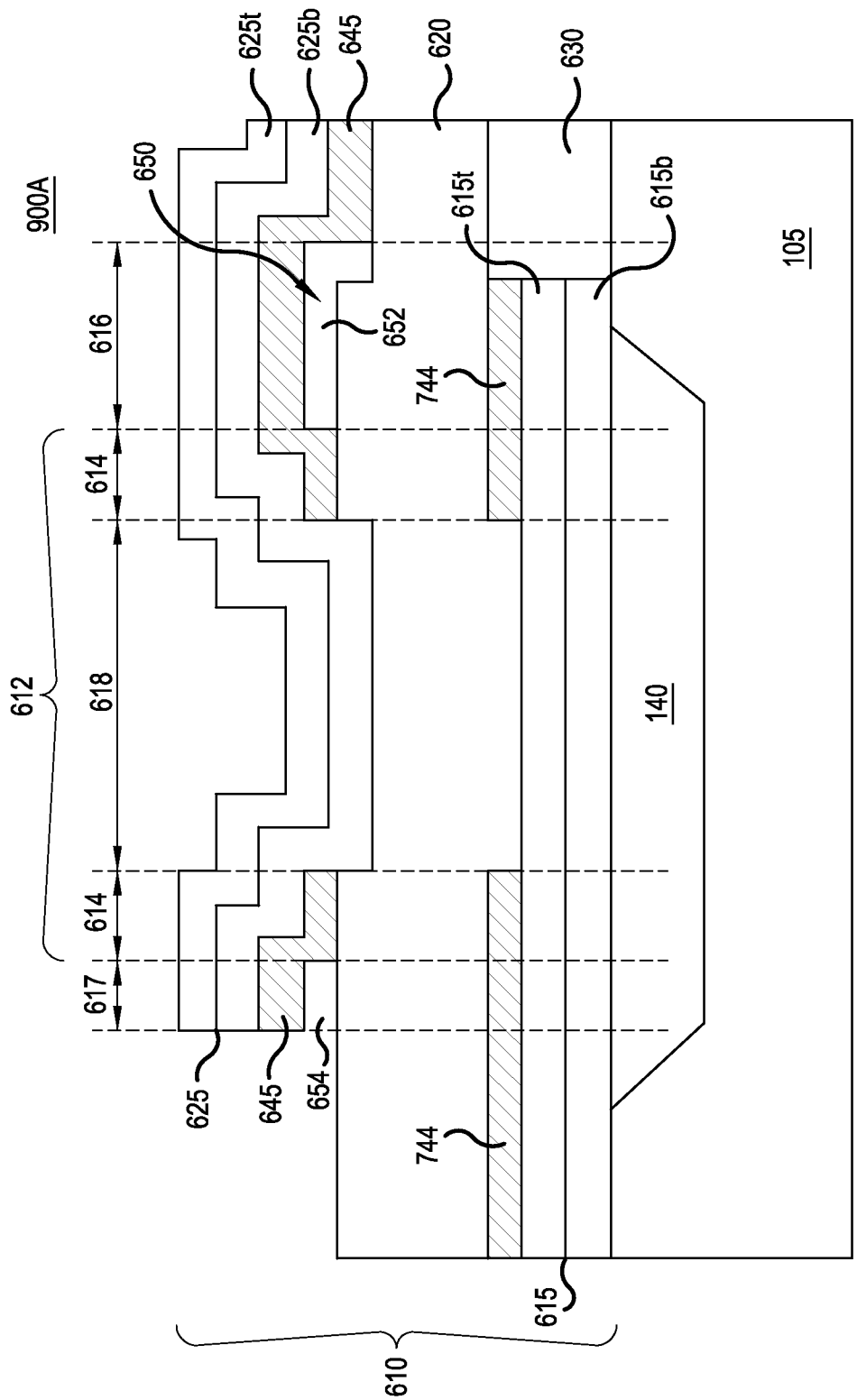
FIGS. 9A and 9B are cross-sectional views of acoustic resonators including ARLs and lateral features, according to representative embodiments.
Figure 9B:
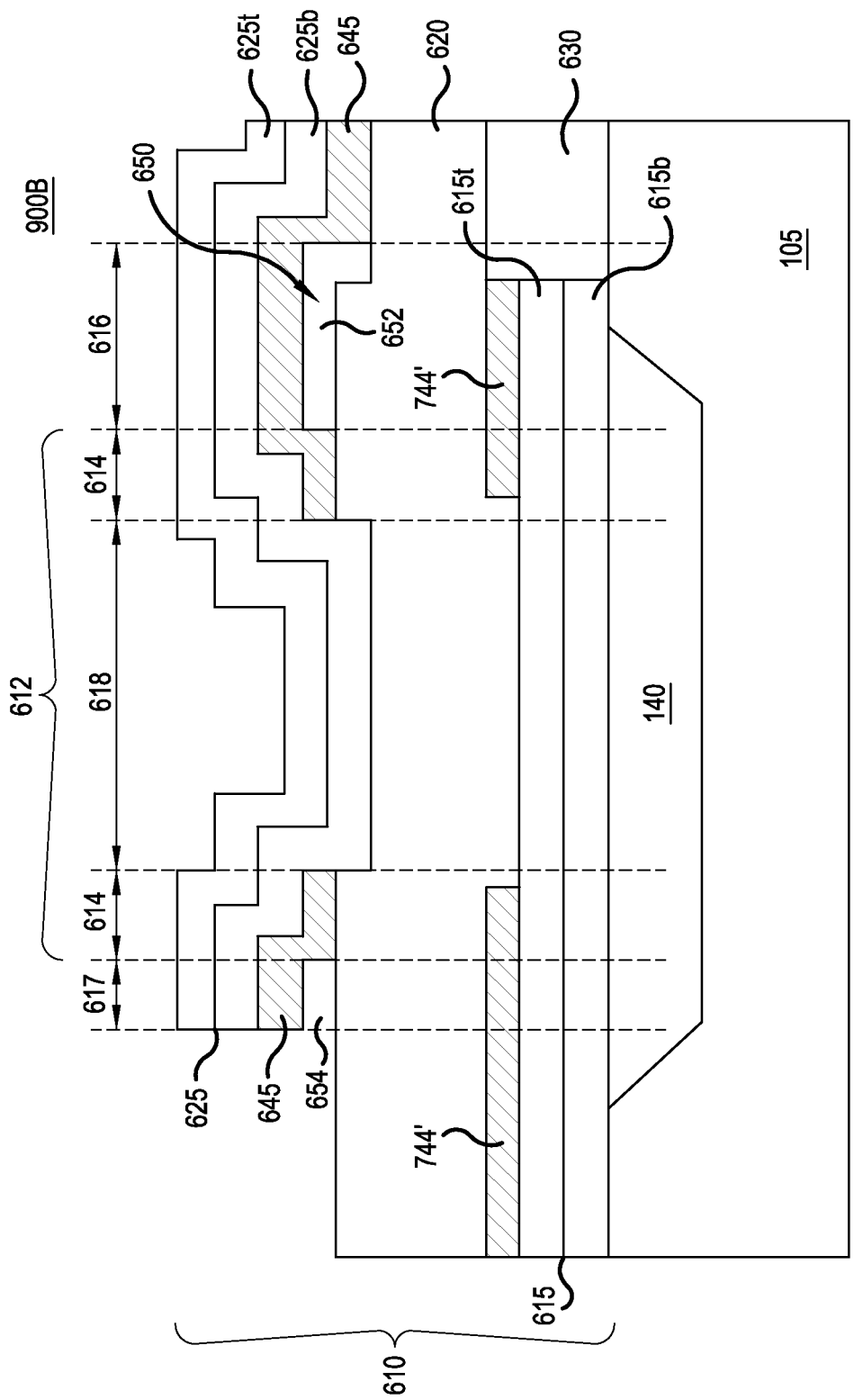
Figure 10:
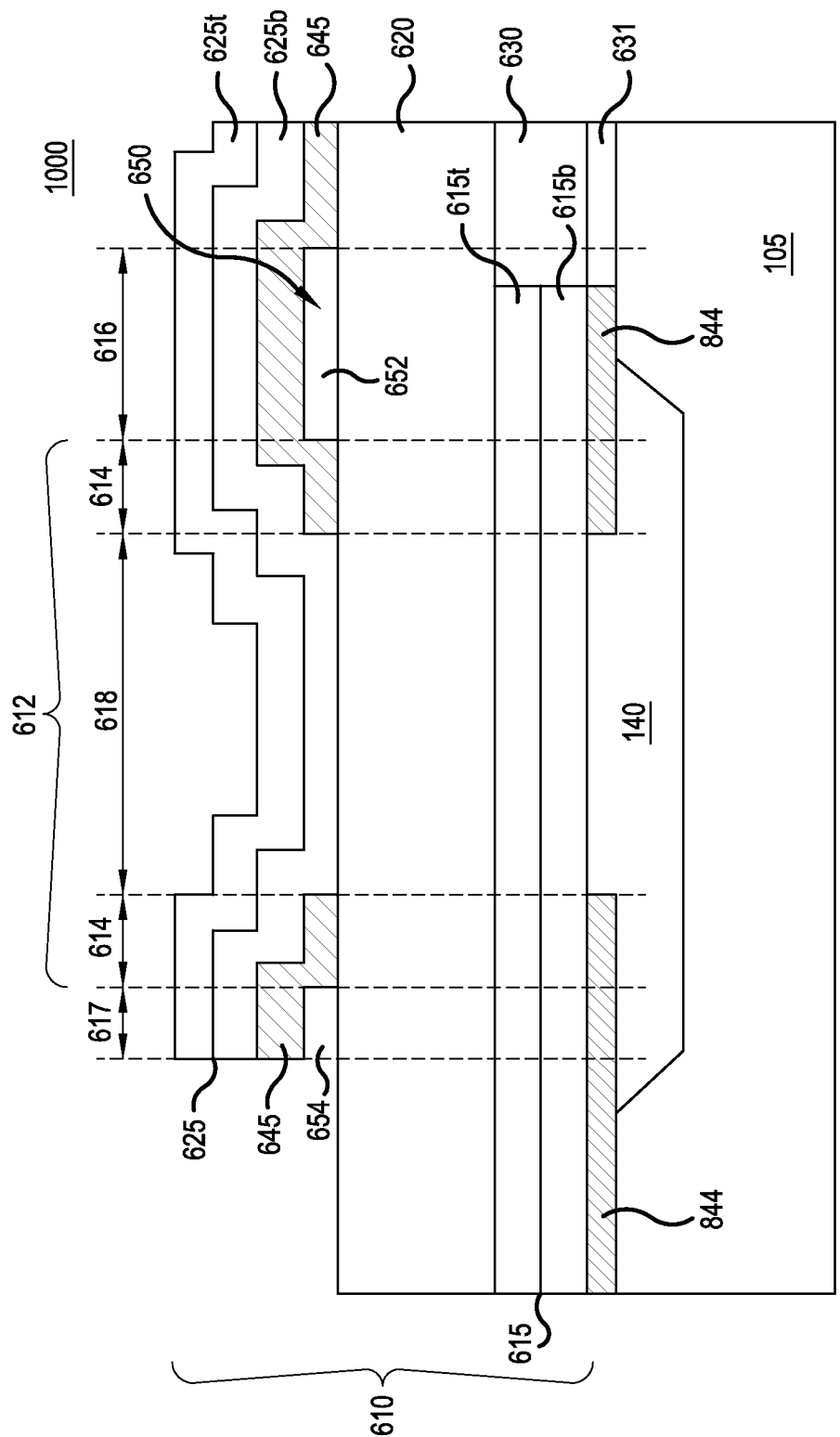
FIG. 10 is a cross-sectional view of an acoustic resonator including ARLs and lateral features, according to a representative embodiment.
Figure 11:
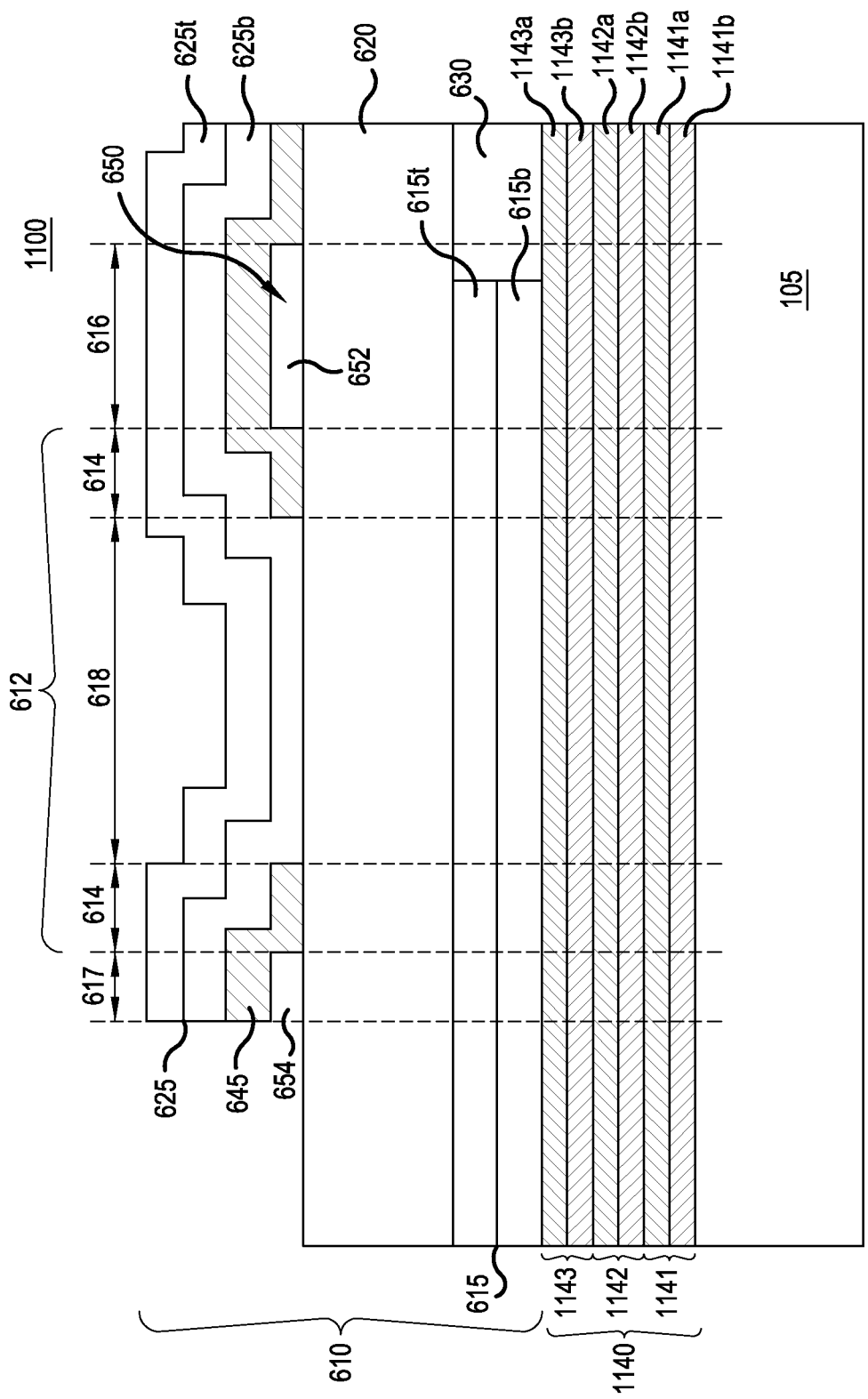
FIG. 11 is a cross-sectional view of an acoustic resonator including ARLs and lateral features, according to a representative embodiment.

FIGS. 6-11 are cross-sectional diagrams illustrating acoustic resonators that include both electrode(s) with ARL (s) and lateral performance enhancement features, according to representative embodiments. The acoustic resonators shown in FIGS. 6-11 may have apodized pentagon shapes, as shown in FIG. 1A, although other shapes may be incorporated, such as quadrilaterals or hexagons, for example. Also, in the examples depicted in FIGS. 6-10, the acoustic resonator is an FBAR (with a cavity formed in the substrate), for convenience of explanation. However, it is understood that other types of acoustic resonators may be included, such as SMRs, without departing from the scope of the present teachings. FIG. 11, in particular, provides a cross-sectional diagram of an SMR similar to the FBAR depicted in FIG. 6, except with an acoustic reflector (e.g., a DBR) formed on the substrate in place of the cavity as the accosting reflecting feature. It is understood that the same general configurations may be included in acoustic resonators having frames and/or air-rings in various locations, without departing from the scope of the present teachings.

Figure 6:
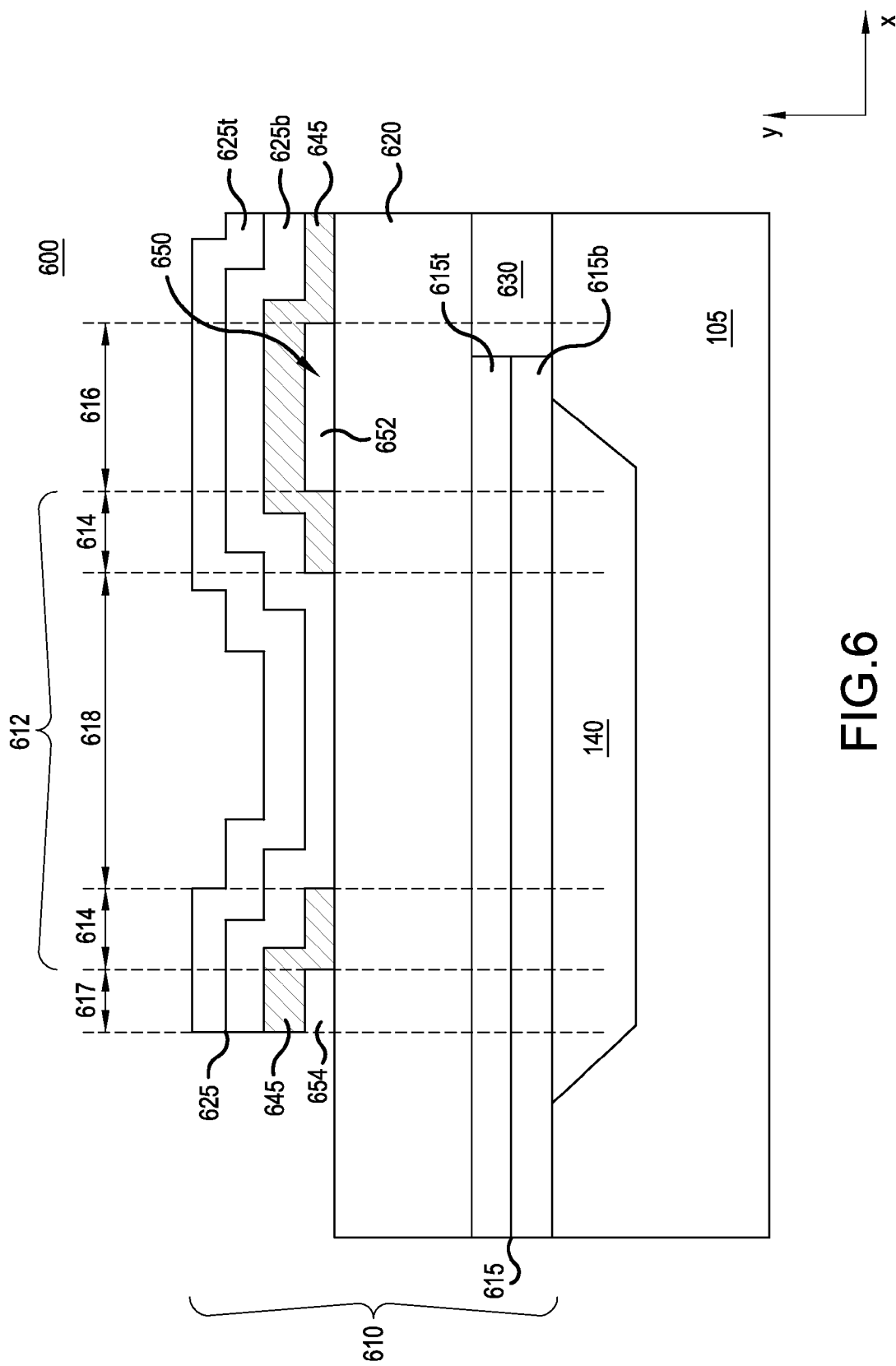
FIG. 6 is a cross-sectional view of an acoustic resonator including ARLs and lateral features, according to a representative embodiment.

Referring to FIG. 6, acoustic resonator 600 (e.g., an FBAR) comprises the substrate 105 defining the air cavity 140, a first (bottom) electrode 615 disposed on the substrate 105 and air cavity 140, a planarization layer 630 disposed adjacent to first electrode 615 on the substrate 105, a piezoelectric layer 620 disposed on the first electrode 615 and the planarization layer 630, and a second (top) electrode 625 disposed on the piezoelectric layer 620. Collectively, first electrode 615, the piezoelectric layer 620, and the second electrode 625 constitute an acoustic stack 610 of acoustic resonator 600. Also, an overlap among the first electrode 615, the piezoelectric layer 620 and the second electrode 625 over the air cavity 140 defines a main membrane region 612 of the acoustic resonator 600. Dotted vertical lines indicate the boundary of the main membrane region 612. Although not shown, a passivation layer may be present on top of second electrode 625 (in each embodiment) with thickness sufficient to insulate all layers of the acoustic stack from the environment, including protection from moisture, corrosives, contaminants, debris and the like.

Similar to the configuration of acoustic resonator 100 shown in FIG. 1B, each of the first and second electrodes 615 and 625 include an ARL, as discussed above. That is, first electrode 615 comprises a bottom conductive layer 615b and a top conductive layer 615t, and second electrode 625 comprises a bottom conductive layer 625b and a top conductive layer 625t. The conductive layers of first and second electrodes 615 and 625 are formed of materials that have acoustic impedances that increase with their distance from piezoelectric layer 620. For example, bottom conductive layer 615b and top conductive layer 625t may be formed of a material having relatively high acoustic impedance, such as (W) or iridium (Ir), while top conductive layer 615t and bottom conductive layer 625b may be formed of a material having relatively low acoustic impedance, such as molybdenum (Mo) or niobium (Nb). Various alternative materials that can be used in first and second electrodes 615 and 625 (in addition to or instead of those listed above) include, e.g., aluminum (Al), platinum (Pt), ruthenium (Ru), or hafnium (Hf). Substantially the same benefits of the ARLs discussed above apply to the first and second electrodes 615 and 625, and additional benefits are provided by lateral features, top air-ring 650 and top frame 645.

Top air-ring 650 is formed between the piezoelectric layer 620 and the second electrode 625, and defines an outside boundary of the main membrane region 612. More particularly, in the depicted embodiment, an upper boundary of the top air-ring 650 is provided by top frame 645, which is an add-on frame formed on the piezoelectric layer 620. Notably, the shapes of the top air-ring 650 and the top frame 645 (discussed further below) propagate through the second electrode 625, giving it an irregular shape.

The top air-ring 650 extends along all or a portion of the perimeter of the acoustic resonator 600. In the cross-sectional view, the top air-ring 650 includes an air-bridge 652 and an air-wing 654. The width of the air-bridge 652 defines an air-bridge extension region 616 adjacent the main membrane region 612. Likewise, the width of the air-wing 654 defines an air-wing region 617, also adjacent the main membrane region 612. Dotted vertical lines indicate the boundaries of air-bridge extension region 616 and the air-wing region 617, respectively. The air-bridge 652 and the air-wing 654 have respective inner edges that substantially define an outer boundary of the main membrane region 612.

The air-bridge 652 is disposed on the connection side (e.g., connection side 101 in FIG. 1A) of the second electrode 625, and therefore is enclosed by the second electrode 625. The air-wing 654 is disposed along the remaining sides of the acoustic resonator 600 (i.e., along the remaining perimeter), and therefore is open on one side. Although air-bridge 652 and air-wing 654 are shown with rectangular cross-sections, these structures (and other air-bridges or air-wings described herein) may have other shapes, such as trapezoidal cross-sectional shapes, without departing from the scope of the present teachings. Examples of configurations, dimensions, alternative shapes, and the like with regard to air-bridges and/or air-wings are described and illustrated in U.S. Patent Application Publication No. 2012/0218057 (published Aug. 30, 2012) to Burak et al., U.S. Patent Application Publication No. 2010/0327697 (published Dec. 30, 2010) to Choy et al.; and U.S. Patent Application Publication No. 2010/0327994 (published Dec. 30, 2010) to Choy et al., the disclosures of which are hereby incorporated by reference in their entireties.

In certain embodiments, the air-ring 650 (and other air-rings described in connection with representative embodiments below) extends over the cavity 140 by an overlap (also referred to as decoupling region), determining separation of the outer edge of the main membrane region 612 from the substrate 105 edge. Also, the air-bridge 652 of the air-ring 650 extends over the piezoelectric layer 620 by an air-bridge extension (also referred to as the air-bridge extension region 616, mentioned above). The decoupling region has a width (x-dimension) of approximately 0.0 µm (i.e., no overlap with the cavity 140) to approximately 10.0 µm, and the air-bridge extension region 616 has a width of approximately 0.0 µm (i.e., no air-bridge) to approximately 50.0 µm.

Generally, optimum widths of the decoupling region and the air-bridge extension region 616 of the air-bridge 652 (and other air-bridges described in connection with representative embodiments below) depend on the reflection and suppression of the eigen-modes at the boundary of the main membrane region 612 and the decoupling region (i.e., the cavity overlap). Due to substantially increased cut-off frequency of the combined first electrode 615 and piezoelectric layer 620 stack in the decoupling region, only complex evanescent modes (for the thickness-extensional motion) and propagating flexural and dilatational modes can exist at the operating frequency of the acoustic resonator 600. Also, due to substantially increased cut-off frequency of the second electrode 625 in the air-bridge extension region 616, only complex evanescent modes (for the thickness-extensional motion) and propagating flexural and dilatational modes can exist at the operating frequency of the acoustic resonator 600. The complex evanescent modes in the decoupling region and the air-bridge extension region 616 are characterized by a characteristic decay length and by a specific propagation constant. Thus the air-bridge 652, for example, needs to be wide enough to ensure suitable decay of complex evanescent waves excited at the boundary of the main membrane region 612 and the decoupling region and the air-bridge extension region 616.

Generally, wide decoupling region and air-bridge extension region 616 allow for minimizing of tunneling of energy into the substrate 105, where propagating modes exist at the frequency of operation. On the other hand, when the air-bridge extension region 616 of the air-bridge 652 is too wide, reliability issues can arise and it can also limit similar acoustic resonators (not shown) from being placed in proximity (thus unnecessarily increasing the total area of a chip). In practical situations the propagating components of the complex evanescent and propagating flexural and dilatational waves in the decoupling region and the air-bridge extension region 616 may be used to find the optimum widths, respectively. In general, for any single propagating or complex mode, when the width of the decoupling region or the air-bridge extension region 616 of the air-bridge 652 is about equal to an odd multiple of the quarter-wavelength of a given eigen-mode, the reflectivity of that eigen-mode may be further increased, which may be manifested by parallel resistance Rp and Q-factor attaining maximum values. However, since it may be difficult to satisfy such conditions simultaneously for all the complex and propagating eigen-modes supported by both regions, optimization of air-bridge 652 geometry for high parallel resistance Rp and Q-factor values is done numerically and experimentally.

The air-bridge 652 (and other bridges described in connection with representative embodiments below) has a height (y-dimension in the coordinate system of FIG. 6) of approximately 300 Å to approximately 5000 Å. Notably, the lower limit of the height is determined by the limits of the process of releasing sacrificial material in the forming of the air-bridge 652 (and other bridges described in connection with representative embodiments below), and the upper limit of the height is determined by the quality of layers deposited over the air-bridge 652 (and other bridges described in connection with representative embodiments) and by the quality of subsequent processing of possibly non-planar structures.

As mentioned above, the acoustic resonator 600 further comprises the top frame 645 disposed on a top surface of the piezoelectric layer 620 (although the top frame 645 does not physically contact those portions of the piezoelectric layer 620 where the air-ring 650 is arranged). In the depicted embodiment, the top frame 645 is an add-on frame, which is typically easier to fabricate than a composite frame (integrally formed within an electrode), for example. The top frame 645 has an inner edge that defines a boundary of an active region 618 formed within the main membrane region 612. A frame region 614 is formed between the inner edge of the top frame 645 (which substantially coincides with the outer boundary of the active region 618) and an inner edge of the top air-ring 650 (which substantially coincides with the outer boundary of the main membrane region 612). Thus, the main membrane region 612 effectively consists of the active region 618 and the frame region 614.

Generally, the top frame 645 minimizes scattering of electrically excited piston mode at edges of the second electrode 625, and improves confinement of mechanical motion to the active region 618. Thus, the top frame 645 is able to suppress excitation of propagating modes. Various enhancements provided by frames (such as top frame 645) and air-rings (such as air-ring 650) to acoustic resonator performance are described, for example, by U.S. patent application Ser. No. 14/192,599 to Burak et al. (filed Feb. 27, 2014) (issued as U.S. Pat. No. 9,571,064 on Feb. 14, 2017), which is hereby incorporated by reference in its entirety.

The top frame 645 may be formed of one or more conductive or dielectric materials, such as copper (Cu), molybdenum (Mo), aluminum (Al), tungsten (W), iridium (Ir), borosilicate glass (BSG), tetraethyl orthosilicate (TEOS), carbon-doped silicon oxide (CDO), silicon carbide (SiC), silicon nitride (SiN), silicon dioxide (SiO2), aluminum oxide (Al2O3), aluminum nitride (AlN), zinc oxide (ZnO), lead zirconium titanate (PZT), diamond or diamond-like carbon (DLC), for example. In various configurations, the top frame 645 may be formed of the same material as the bottom conductive layer 625b (e.g., molybdenum (Mo) or niobium (Nb)), the same material as the top conductive layer 625t (e.g., such as (W) or iridium (Ir)), or some material different from both the bottom and top conductive layers 625b and 625t.

The planarization layer 630 may be formed of non-etchable boron-doped silicon glass (NEBSG), for example. As stated above, the planarization layer 630 is not strictly required for the functioning of acoustic resonator 600, but its presence can confer various benefits. For instance, the presence of the planarization layer 630 tends to improve the structural stability of acoustic resonator 600, may improve the quality of growth of subsequent layers, and may allow first electrode 615 to be formed without its edges extending beyond the cavity 140.

The air-bridge 652 is typically designed to be wide enough to cross over the first electrode 615 edge (as shown in FIG. 6) and to ensure suitable decay of complex evanescent waves excited at the boundary of main membrane region 612 and the air-bridge extension region 616. The air-wing 654 is typically designed to have a width corresponding to resonant enhancement of parallel resistance Rp resulting from resonant suppression of propagating modes supported by main membrane region 612 and the outside regions. As mentioned above, if the air-bridge 652 or the air-wing 654 is too wide, reliability issues can arise and can also limit the placement of similar FBARs (not shown) from being placed in proximity (thus unnecessarily increasing the total area of a chip). In addition, increased width of the air-wing 654 generally results in decrease in the electromechanical effective coupling coefficient $kt^2$ due to increased through-air capacitive coupling of the second electrode 625 with the acoustic stack 610 comprising the piezoelectric layer 620 and the first electrode 615, which in turn results in a degradation of insertion loss ($S_{21}$) of a filter comprising multiple FBARs, for example. Thus, in general, optimum widths of the air-bridge 652 and air-wing 654 may be determined experimentally and numerically to meet the electrical performance and reliability requirements of the product comprising the acoustic resonator 600.

As mentioned above, the top air-ring 650, comprising the air-bridge 652 and the air-wing 654, typically defines a perimeter along the main membrane region 612 of the acoustic resonator 600. The main membrane region 612 thus includes the portions of the acoustic resonator 600 disposed over the air cavity 140 and bounded by the perimeter provided by the top air-ring 650. Accordingly, the main membrane region 612 is bordered around its perimeter by an acoustic impedance discontinuity created at least in part by air-bridge 652 and air-wing 654, and above and below (the air cavity 140) by an acoustic impedance discontinuity due to the presence of air. Thus, a resonant cavity is beneficially provided in the main membrane region 612 of the acoustic resonator 600.

In the depicted embodiment, air-bridge 652 and air-wing 654 are unfilled, i.e., they contain air. In other embodiments, these structures may be "filled", e.g., with a dielectric or metal material to provide the desired acoustic impedance discontinuity. It is noted that the described structures do not necessarily have to extend along all edges of acoustic resonator 600 (as well as the acoustic resonators depicted in FIGS. 7-11). For example, they may be provided on only a subset of a five-sided acoustic resonator (such as acoustic resonator 100 shown in FIG. 1A).

Acoustic impedance mismatches provided by air-bridge 652 and air-wing 654 cause reflection and suppression of acoustic waves at the boundary that may otherwise propagate out of the main membrane region 612 resulting in energy loss. Accordingly, the air-bridge 652 and the air-wing 654 may serve to suppress excitation on unwanted propagating modes in the main membrane region 612 and outside regions, resulting in better energy confinement within the main membrane region 612 and reduction of energy losses to acoustic radiation in the acoustic resonator 600. Reducing such losses increases the Q-factor of acoustic resonator 600. In filter applications of acoustic resonator 600, for example, as a result of the reduced energy loss, the insertion loss ($S_{21}$) may be beneficially improved.

Figure 7:
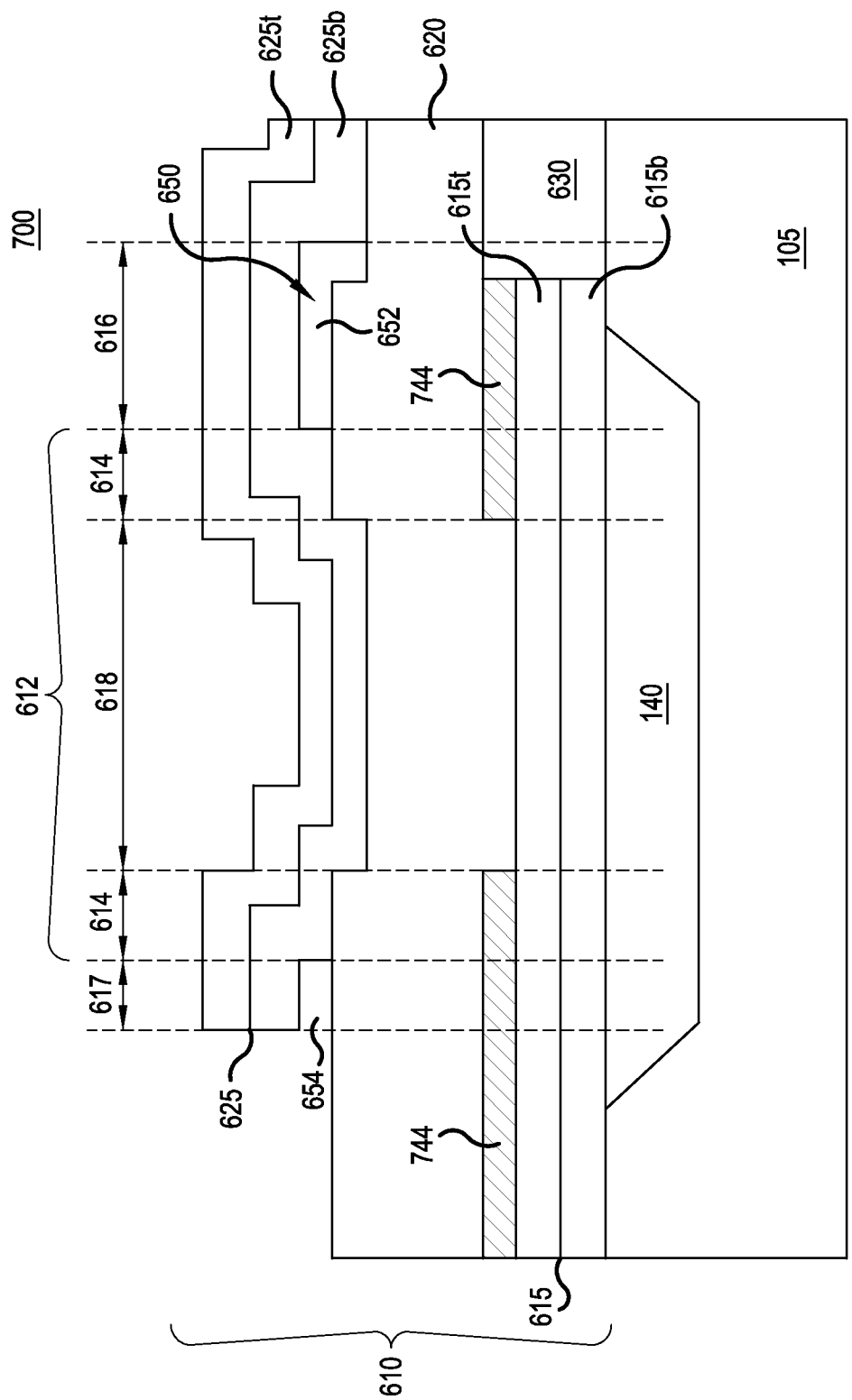
FIG. 7 is a cross-sectional view of an acoustic resonator including ARLs and lateral features, according to a representative embodiment.

Referring to FIG. 7, acoustic resonator 700 is similar to acoustic resonator 600 shown in FIG. 6, except for the location of the lateral feature. In particular, instead of top frame 645, acoustic resonator 700 includes a bottom frame 744 is formed between the first electrode 615 and the piezoelectric layer 620. In other words, the bottom frame 744 is formed on a top surface of the first electrode 615 as an add-on frame.

Because the bottom frame 744 is an add-on frame, its shape propagates through the piezoelectric layer 620, resulting in a substantially non-planar top surface profile of the piezoelectric layer 620, similar to the non-planar top surface of the second electrode 625 resulting from placement of the air-ring 650. Generally, though, because only a passivation layer (not shown) usually would be formed on the second electrode 625, the non-planar top surface profile of the second electrode 625 would not have any significant impact on structural robustness of the acoustic resonator 600. However, the non-planar combined top surfaces of the first electrode 615 and the bottom frame 744 may present difficulties in formation of the piezoelectric layer 620, the second electrode 625 and/or the top air-ring 650. Therefore, the thickness of the add-on bottom frame 744 is kept relatively small (e.g., no greater than about 1000 Å). This prevents formation of voids in the piezoelectric layer 620, for example, that may otherwise form in response to a thicker add-on bottom frame 744.

The bottom frame 744 has an inner edge that defines a boundary of the active region 718 formed within the main membrane region 612. The frame region 614 is formed between the inner edge of the bottom frame 744 (which substantially coincides with the outer boundary of the active region 618) and an inner edge of the top air-ring 650 (which substantially coincides with the outer boundary of the main membrane region 612). The bottom frame 744 may be formed of the same materials as discussed above with regard to the top frame 645 in FIG. 6, for example. Likewise, in various configurations, the bottom frame 744 may be formed of the same material as the top conductive layer 615*t* (e.g., molybdenum (Mo) or niobium (Nb)), the same material as the bottom conductive layer 615*b* (e.g., such as (W) or iridium (Ir)), or some material different from both the top and bottom layers 615*t* and 615*b*.

Figure 8:
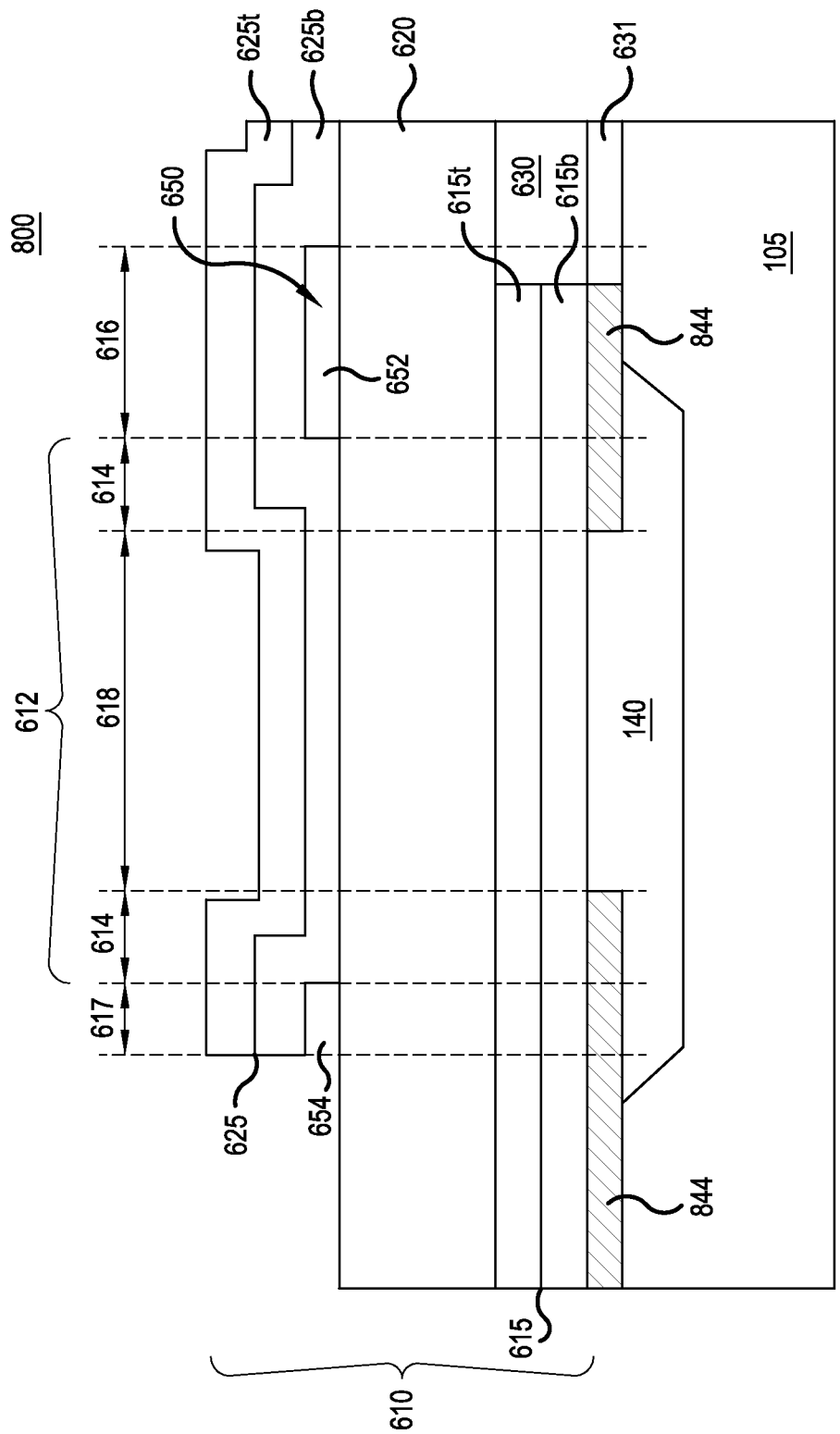
FIG. 8 is a cross-sectional view of an acoustic resonator including ARLs and lateral features, according to a representative embodiment.

Referring to FIG. 8, acoustic resonator 800 is similar to acoustic resonator 700 shown in FIG. 7, except for the location of the bottom frame. In particular, bottom frame 844 in the acoustic resonator 800 is formed between the substrate 105 and the first electrode 615, extending into portions of the cavity 140, as compared to the bottom frame 744 in the acoustic resonator 700, which is formed between the first electrode 615 and the piezoelectric layer 620, as discussed above. In other words, the bottom frame 844 is formed below the first electrode 615. The bottom frame 844 provides benefits similar to the bottom frame 744, although its performance and manufacture varies somewhat due to the different location. An illustrative fabrication technique of a bottom frame, such as the bottom frame 844, is described by U.S. patent application Ser. No. 14/192,599 to Burak et al. (filed Feb. 27, 2014) (issued as U.S. Pat. No. 9,571,064 on Feb. 14, 2017), which is hereby incorporated by reference in its entirety.

The bottom frame 844 has an inner edge that defines a boundary of the active region 618 formed within the main membrane region 612. The frame region 614 is formed between the inner edge of the bottom frame 844 (which substantially coincides with the outer boundary of the active region 618) and an inner edge of the top air-ring 650 (which substantially coincides with the outer boundary of the main membrane region 612). The bottom frame 844 may be formed of the same materials as discussed above with regard to the top frame 645 in FIG. 6, for example. Likewise, in various configurations, the bottom frame 844 may be formed of the same material as the bottom conductive layer 615*b* (e.g., such as (W) or iridium (Ir)), the same material as the top conductive layer 615*t* (e.g., molybdenum (Mo) or niobium (Nb)), or some material different from both the bottom and top layers 615*b* and 615*t*.

In the depicted embodiment, an additional planarization layer 631 is disposed on the substrate 105 adjacent to the bottom frame 844, providing a substantially planar top surface on which the first electrode 615 and the planarization layer 630 are formed. That is, the first electrode 615 and the adjacent planarization layer 630 are disposed on the bottom frame 844 and the adjacent additional planarization layer 631. The first electrode 615 and the adjacent planarization layer 630 thus provide a substantially planar top surface on which the piezoelectric layer 620 is formed. The planarization layer 630 and the additional planarization layer 631 may be formed of borosilicate glass (BSG), for example. The second electrode 625 is formed on the piezoelectric layer 620, and the top air-ring 650 (including the air-bridge 652 and the air-wing 654) is formed between the piezoelectric layer 620 and the second electrode 625. An additional benefit of the configuration of the bottom frame 844 (and the additional planarization layer 631) is that the first electrode 615 provides a planar top surface on which to form the piezoelectric layer 620. Also, the thickness of the bottom frame 844 is not restricted, as in the case of the bottom frame 744 when included as an add-on frame as shown in FIG. 7.

In the depicted embodiments, top frame 645, the bottom frame 744 and the bottom frame 844 are shown as one layer having a rectangular cross-section. However, it is understood that one or more of the top frame 645, the bottom frame 744 and the bottom frame 844 may be formed of multiple stacked layers, which may or may not be stepped, such that the upper layers have consecutively shorter widths than the preceding lower layers on which they are stacked. Such stepped frame structures provide multiple (vertical) interfaces, as described for example in U.S. Patent Application Publication No. 2013/0063227 (published Mar. 14, 2013) to Burak et al., the disclosure of which is hereby incorporated by reference. Other frame configurations may also be incorporated, such as additional frame configurations disclosed by U.S. patent application Ser. No. 13/781,491, filed Feb. 28, 2013 (issued as U.S. Pat. No. 9,490,771 on Nov. 8, 2016), for example, without departing from the scope of the present teachings.

Referring to FIG. 9A, acoustic resonator 900A includes both the top frame 645 as shown in FIG. 6 and the bottom frame 744 as shown in FIG. 7, as well as the air-ring 650. The acoustic resonator 900A therefore has three lateral features, in addition to the first and second electrodes 615 and 625 containing ARLs, respectively. In the depicted embodiment, the top frame 645 has an inner edge that is substantially aligned with an inner edge of the bottom frame 744. Therefore, the inner edges of the top and bottom frame 645 and 744 together define the outer boundary of the active region 618 formed within the main membrane region 612. An outer edge of the top frame 645 (defining the frame region 614), which is substantially aligned with an inner edge of the top air-ring 650, substantially coincides with the outer boundary of the main membrane region 612. The frame region 614 is formed between the outer boundary of the active region 618 and the outer boundary of the main membrane region 612, as discussed above.

When multiple frames (e.g., top frame 645 and bottom frame 744) included in an acoustic resonator (e.g., acoustic resonator 900A), the frame having an inner edge that extends furthest into the main membrane region 612 defines the active region 618. For example, FIG. 9B depicts acoustic resonator 900B, which includes top frame 645 and bottom frame 744', where the inner edge of the top frame 645 extends further into the main membrane region 612 than does the inner edge of the bottom frame 744'. Therefore, the outer boundary of the active region 618 is defined by the inner edge of the top frame 645, and not the inner edge of the bottom frame 744'. Similarly, if the inner edge of the bottom frame 744' were to extend further into the main membrane region 612 than the inner edge of the top frame 645, then the outer boundary of the active region 618 would be defined by the inner edge of the bottom frame 744', and not the inner edge of the top frame 645.

Referring to FIG. 10, acoustic resonator 1000 includes both the top frame 645 as shown in FIG. 6 and the bottom frame 844 as shown in FIG. 8, as well as the air-ring 650. The acoustic resonator 1000 therefore has three lateral features, in addition to the first and second electrodes 615 and 625 containing ARLs, respectively. In the depicted embodiment, the top frame 645 has an inner edge that is substantially aligned with an inner edge of the bottom frame 844. Therefore, the inner edges of the top and bottom frame 645 and 844 together define the outer boundary of the active region 618 formed within the main membrane region 612. An outer edge of the top frame 645 (defining the frame region 614), which is substantially aligned with an inner edge of the top air-ring 650, substantially coincides with the outer boundary of the main membrane region 612. The frame region 614 is formed between the outer boundary of the active region 618 and the outer boundary of the main membrane region 612, as discussed above.

In alternative embodiments, the inner edge of one of the top frame 645 or the bottom frame 844 may extend further into the main membrane region 612 than that other (as shown in FIG. 9B, for example, with reference to top frame 645 and bottom frame 744'). In this case, the outer boundary of the active region 618 is defined by the inner edge of the one of the top frame 645 or the bottom frame 844 that extends further into the main membrane region 612.

Each of the acoustic resonators and variations thereof, discussed above with reference to FIGS. 6-10 (e.g., acoustic resonators 600, 700, 800, 900A, 900B and 1000), are FBARs, where the acoustic reflecting feature is implemented by an air cavity 140. However, each of these configurations may be implemented as an SMR, without departing from the scope of the present teachings.

FIG. 11 is a cross-sectional of an SMR including ARLs and lateral features, according to a representative embodiment. Referring to FIG. 11, acoustic resonator 1100 has substantially the same cross-section as acoustic resonator 600 in FIG. 6, except that the acoustic reflecting feature is implemented as an acoustic reflector 1140 instead of an air cavity 140. The acoustic resonator 1100 may have the same apodized shape(s) shown in FIG. 1A, discussed above.

More particularly, the acoustic resonator 1100 includes substrate 105, acoustic reflector 1140 disposed on the substrate 105, first electrode 115 disposed on the acoustic reflector 1140, planarization layer 630 disposed adjacent to first electrode 615 on the acoustic reflector 1140, piezoelectric layer 620 disposed on the first electrode 615 and the planarization layer 630, and second electrode 625 disposed on the piezoelectric layer 620. In addition, the acoustic resonator 1100 includes the lateral features shown in FIG. 6. That is, the acoustic resonator 1100 includes top air-ring 650 formed between the piezoelectric layer 620 and the second electrode 625, and top frame 645 formed on the piezoelectric layer 620. The top air-ring 650 defines an outside boundary of the main membrane region 612, and the top frame 645 defines an outside boundary of the active region 618 within the main membrane region 612. The top air-ring 650 includes air-bridge 652 and air-wing 654, where the width of the air-bridge 652 defines an air-bridge extension region 616 and the width of the air-wing 654 defines an air-wing region 617. The air-bridge 652 and the air-wing 654 have respective inner edges that substantially define an outer boundary of the main membrane region 612. A frame region 614 is formed between the inner edge of the top frame 644 (which substantially coincides with the outer boundary of the active region 618) and an inner edge of the top air-ring 650 (which substantially coincides with the outer boundary of the main membrane region 612). Thus, the main membrane region 612 effectively consists of the active region 618 and the frame region 614.

The acoustic reflector 1140 may be an acoustic mirror, such as a distributed Bragg reflector (DBR), as mentioned above. The acoustic reflector 1140 includes multiple pairs of acoustic reflector layer pairs, indicated by representative first acoustic reflector layer pair 1141, second acoustic reflector layer pair 1142, and third acoustic reflector layer pair 1143, sequentially stacked on the substrate 105. The first acoustic reflector layer pair 1141 includes first low acoustic impedance layer 1141a formed of low acoustic impedance material stacked on first high acoustic impedance layer 1141b formed of high acoustic impedance material. The second acoustic reflector layer pair 1142 includes second low acoustic impedance layer 1142a formed of low acoustic impedance material stacked on second high acoustic impedance layer 1142b formed of high acoustic impedance material. The third acoustic reflector layer pair 1143 includes third low acoustic impedance layer 1143a formed of low acoustic impedance material stacked on third high acoustic impedance layer 1143b formed of high acoustic impedance material.

Each of the first, second and third low acoustic impedance layers 1141a, 1142a and 1143a may be formed of various low acoustic impedance materials, such as boron silicate glass (BSG), tetra-ethyl-ortho-silicate (TEOS), silicon oxide (SiOx) or silicon nitride (SiNx) (where x is an integer), carbon-doped silicon oxide (CDO), chemical vapor deposition silicon carbide (CVD SiC), plasma enhanced CVD SiC (PECVD SiC), titanium (Ti) or aluminum. Each of the first, second and third high acoustic impedance layers 1141b, 1142b and 1143b may be formed of various high acoustic impedance materials, such as tungsten (W), molybdenum (Mo), niobium molybdenum (NbMo), iridium (Ir), hafnium oxide (HfO2), aluminum oxide (Al2O3), diamond or diamond-like carbon (DLC). Various illustrative fabrication techniques of acoustic mirrors are described by in U.S. Pat. No. 7,358,831 (Apr. 15, 2008), to Larson III, et al., which is hereby incorporated by reference in its entirety.

Although acoustic resonator 1100 is shown with ALRs and lateral feature corresponding to those of acoustic resonator 600, it is understood that the air cavity 140, 640 may be replaced with an acoustic reflector such as the acoustic reflector 1140 in any of various configurations of FBARs to produce corresponding SMRs, without departing from the scope of the present teachings.

Further, in various embodiments alternative to those depicted in FIGS. 6-11, another (bottom) air-ring may be formed in an acoustic resonator that includes one or more electrodes containing ARLs, respectively. For example, a bottom air-ring may be formed between the bottom electrode (e.g., first electrode 615) and the piezoelectric layer (e.g., piezoelectric layer 620). A portion of the air-ring may overlap the planarization layer (e.g., planarization layer 630), as well. Such a bottom air-ring may be included in addition to or instead of the top air-ring 650. Also, any combinations of the top frame 645 and the bottom frames 744, 744' and 844 may be included in an acoustic resonator with a bottom air-ring, either alone or together with the top air-ring 650, without departing from the scope of the present teachings.

Further, in FIG. 1B, each of the first and second electrodes 115 and 125 include an ARL (e.g., top conductive layer 115t in the first electrode 615 and bottom conductive layer 125b in the second electrode 625). Likewise, in FIGS. 6-11, each of the first and second electrodes 615 and 625 include an ARL (e.g., top conductive layer 615t in the first electrode 615 and bottom conductive layer 125b in the second electrode 625). However, in alternative embodiments, only one of the first electrodes 115, 615 and the second electrodes 125, 625 may include an ARL, while the other of the first electrodes 115, 615 and the second electrodes 125, 625 is formed of a single material, and/or one or both of the first electrodes 115, 615 and the second electrodes 125, 625 may include multiple layers in addition to (or in place of) an ARL, without departing from the scope of the present teachings.

For example, FIGS. 12 through 17 illustrate several alternative configurations for acoustic stacks 110, 610 in acoustic resonators 100, 600, 700, 800, 900A, 900B, 1000 and 1100, according to representative embodiments. FIGS. 12 through 17 also illustrate acoustic impedance profiles for each of those different alternative configurations. Notably, FIGS. 12 through 17 depict simplified rectangular cross-sections of the various acoustic stack configurations for convenience of illustration, and it is understood that the depicted cross-sections, corresponding illustrative materials, and acoustic impedance profiles apply to acoustic resonators with and without air-rings and/or frames, examples of which are discussed above. Also, the material selection in FIGS. 12 through 17 is provided for illustrative purposes only and various other combinations are possible in alternative embodiments.

Figure 12A:
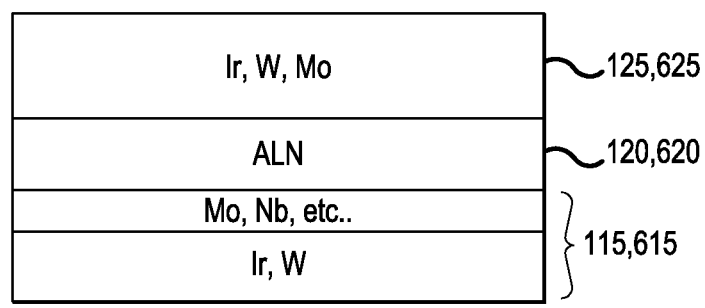
FIG. 12A is a cross-sectional view of an acoustic stack variation for acoustic resonators of FIGS. 1B and 6-11, according to representative embodiments.
Figure 12B:
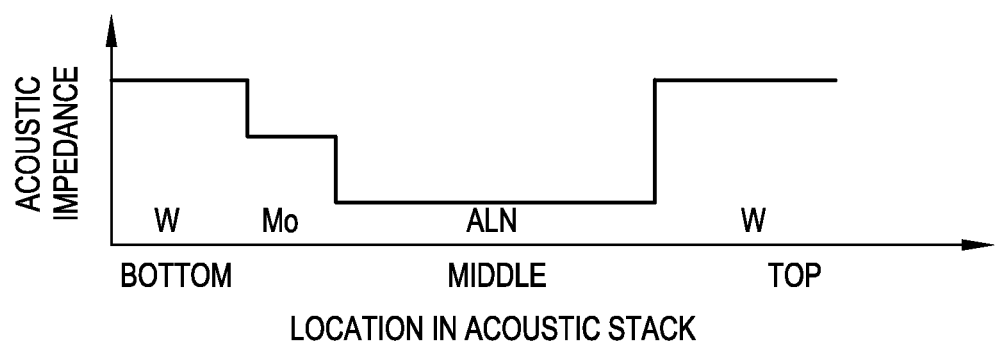
FIG. 12B is a graph illustrating an acoustic impedance profile the acoustic stack illustrated in FIG. 12A.
Figure 13A:
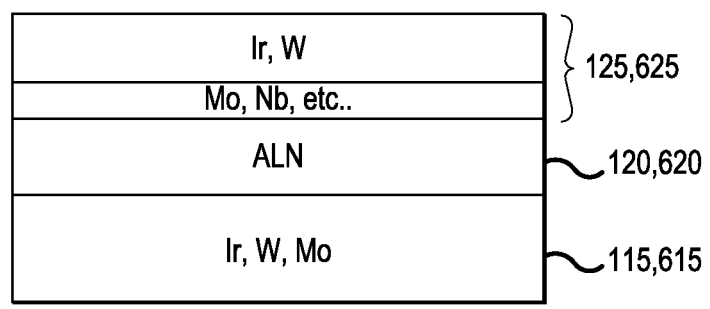
FIG. 13A is a cross-sectional view of an acoustic stack variation for acoustic resonators of FIGS. 1B and 6-11, according to representative embodiments.
Figure 13B:
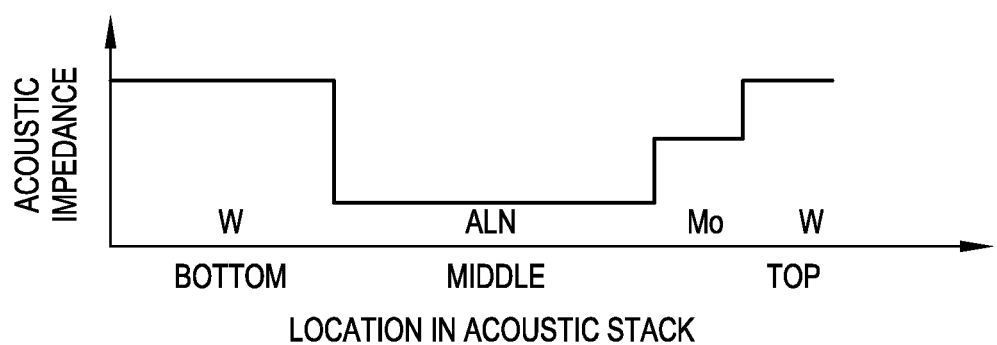
FIG. 13B is a graph illustrating an acoustic impedance profile the acoustic stack illustrated in FIG. 13A.
Figure 14A:
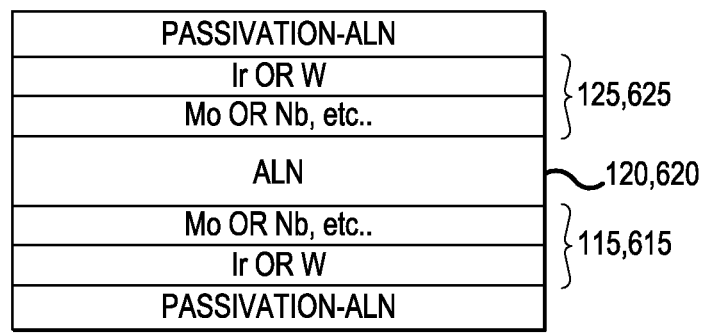
FIG. 14A is a cross-sectional view of an acoustic stack variation for acoustic resonators of FIGS. 1B and 6-11, according to representative embodiments.
Figure 14B:
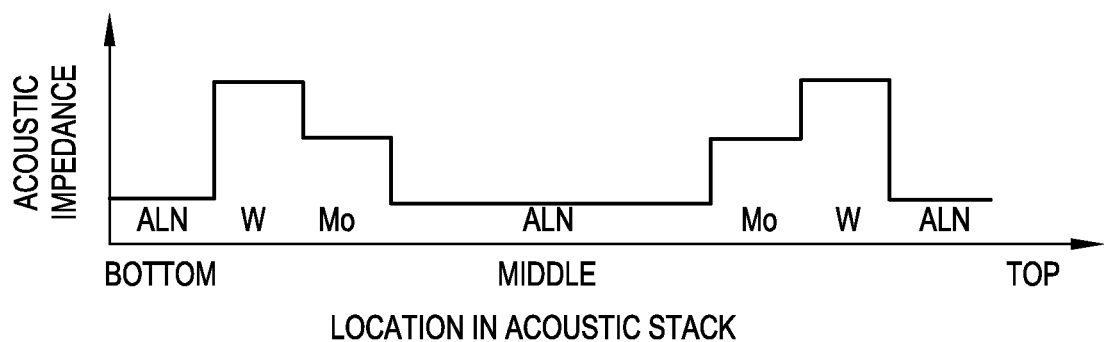
FIG. 14B is a graph illustrating an acoustic impedance profile the acoustic stack illustrated in FIG. 14A.
Figure 15A:
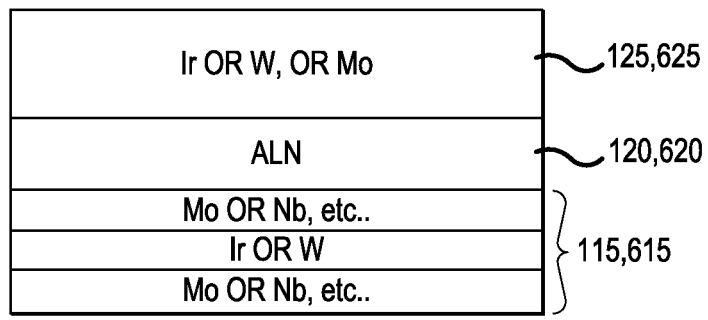
FIG. 15A is a cross-sectional view of an acoustic stack variation for acoustic resonators of FIGS. 1B and 6-11, according to representative embodiments.
Figure 15B:
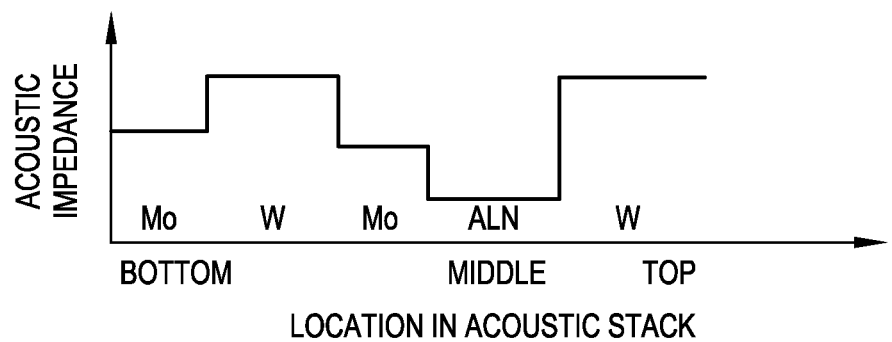
FIG. 15B is a graph illustrating an acoustic impedance profile the acoustic stack illustrated in FIG. 15A.
Figure 16A:
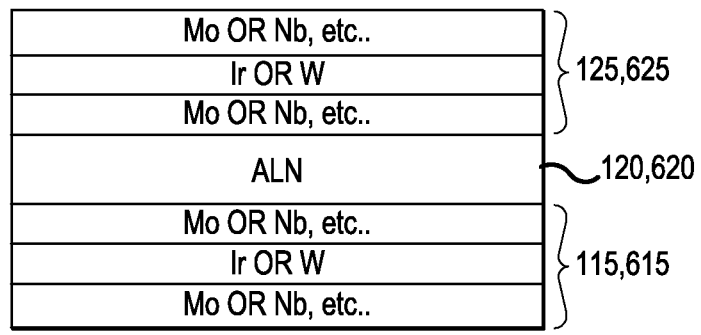
FIG. 16A is a cross-sectional view of an acoustic stack variation for acoustic resonators of FIG. 1B and 6-11, according to representative embodiments.
Figure 16B:
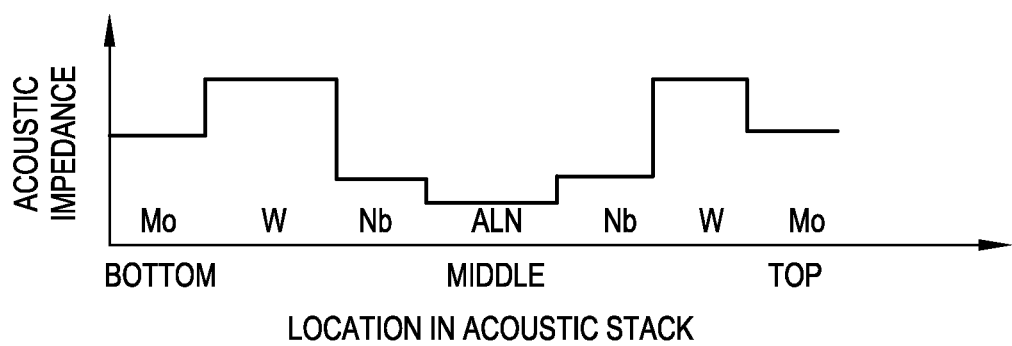
FIG. 16B is a graph illustrating an acoustic impedance profile the acoustic stack illustrated in FIG. 16A.
Figure 17A:
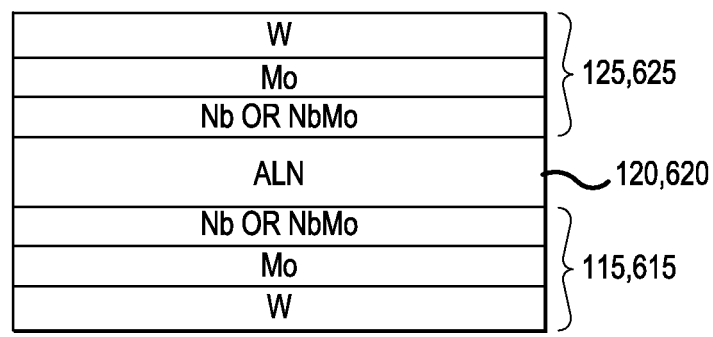
FIG. 17A is a cross-sectional view of an acoustic stack variation for acoustic resonators of FIGS. 1B and 6-11, according to representative embodiments.
Figure 17B:
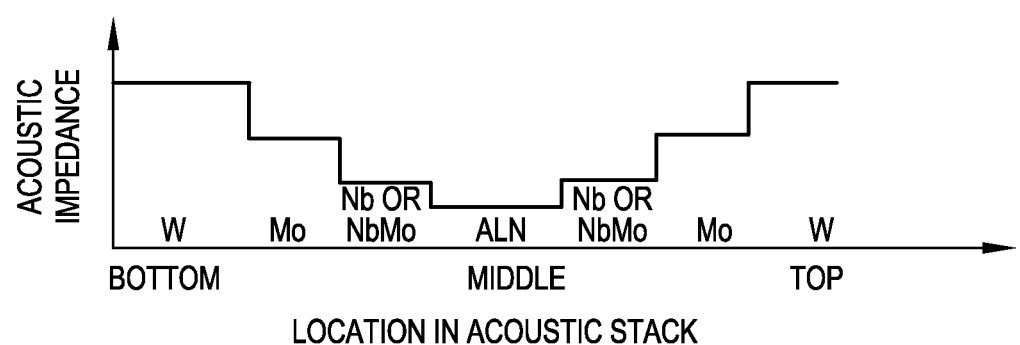
FIG. 17B is a graph illustrating an acoustic impedance profile the acoustic stack illustrated in FIG. 17A.

Referring to FIGS. 12A and 12B, in one embodiment acoustic stack 110, 610 comprises first electrode 115, 615 with two metal layers of different acoustic impedances, and second electrode 125, 625 with a single metal layer. The acoustic impedances of the two metal layers of first electrode 115, 615 increase with distance from piezoelectric layer 120, 620. The layers in FIG. 12A are labeled with various alternative materials, and the graph of FIG. 12B shows a selected example of material for each layer. In each of FIGS. 12 through 17, piezoelectric layer 120, 620 is shown as a layer of AlN, but it could alternatively comprise a different material, such as ASN or ZnO, for example. FIGS. 13 through 17 are similar to FIG. 12, except that the layers of first electrodes 115, 615 and second electrodes 125, 625 are rearranged and/or constituted as shown in the diagrams and graphs. Potential benefits of these alternative configurations will be apparent from the above description of FIGS. 1 through 5.

Figure 18:
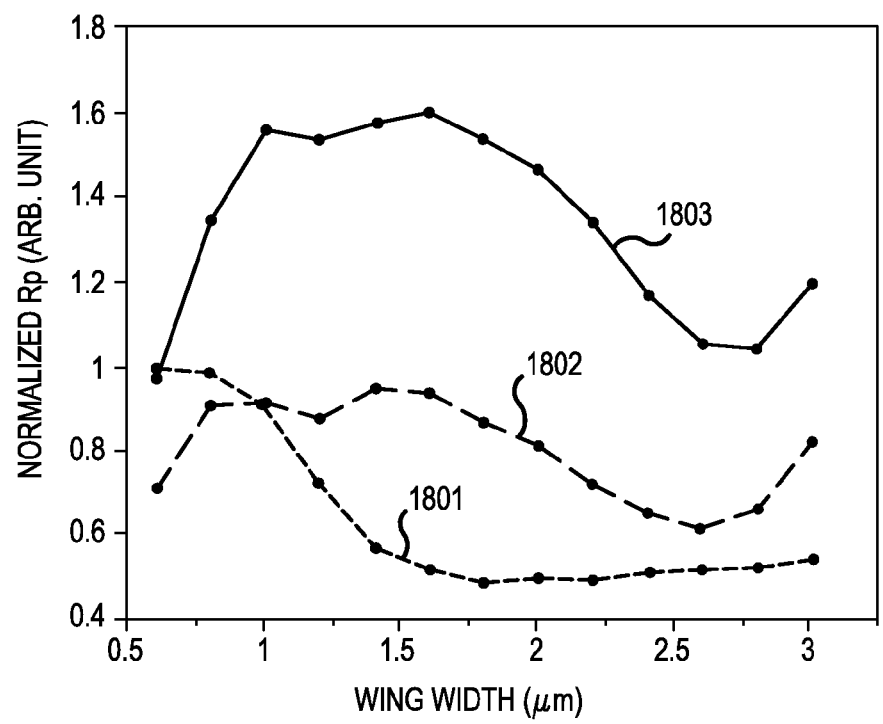
FIG. 18 is a graph of parallel resistance for comparing performance of acoustic resonators with and without ARLs and frames, according to representative embodiments.

FIG. 18 is a graph of parallel resistance for comparing performance of acoustic resonators with and without ARLs and frames, according to representative embodiments. In FIG. 18, the y-axis shows normalized parallel resistance Rp of an acoustic resonator, and the x-axis shows width of an air-ring of the acoustic resonator.

Referring to FIG. 18, trace 1801 shows the relationship between the normalized Rp and air-wing width for an acoustic resonator that has electrodes with ARLs, but no lateral frame. That is, the acoustic resonator includes a bottom electrode having a bottom conductive layer formed of W about 7.3k Å thick and a top conductive layer formed of Mo about 1.3k Å thick, and a top electrode having a bottom conductive layer formed of Mo about 1.2k Å thick and a top conductive layer formed of W about 6.8k Å thick. Trace 1802 shows the relationship between the normalized Rp and air-wing width for an acoustic resonator that has a lateral frame, but no ARLs in the electrodes. That is, the acoustic resonator includes a bottom electrode formed of W about 8.7k Å thick and a top electrode formed of W about 7.8k Å thick, as well as a lateral frame on the top electrode about 2.4 µm wide. Trace 1803 shows the relationship between the normalized Rp and air-wing width for an acoustic resonator that has both electrodes with ARLs and a lateral frame (of the same materials and dimensions discussed above for trace 1801). All stacks also comprise a passivation layer formed of AlN about 6k Å thick. The air-wing widths range from about 0.6 µm to about 3.0 µm.

The trace 1803 shows that inclusion of both ARLs and a lateral frame, along with the air-wing, provides significant improvement in normalized Rp at nearly every wing width. For example, for a wing width of 1.6 µm, trace 1803 shows superior (improved by about 60 percent) normalized Rp, as compared to traces 1801 and 1802. The highest normalized Rp indicated by trace 1801 (ARL with no lateral frame) occurs when the acoustic resonator has a wing about 0.6 um wide, and the highest normalized Rp indicated by trace 1802 (lateral frame with ARL), which is approximately the same value as the highest normalized Rp indicated by trace 1801, occurs when the acoustic resonator has a wing about 1.6 µm wide. The normalized Rp values of almost all data points forming trace 1803 (ARL and lateral frame) are above these values, indicating the enhanced performance by FBAR 100 comprising combination of ARLs and frames.

While example embodiments are disclosed herein, one of ordinary skill in the art appreciates that many variations that are in accordance with the present teachings are possible and remain within the scope of the appended claims. For example, different set of metals may be used in top and bottom electrodes. In another example, replacement fraction of one metal with another metal may be different in top electrode from replacement fraction in the bottom electrode. The embodiments therefore are not to be restricted except within the scope of the appended claims.

The invention claimed is:

1. An acoustic resonator device, comprising:
   a piezoelectric layer;
   a first electrode disposed adjacent to a first surface of the piezoelectric layer;
   a second electrode disposed adjacent to a second surface of the piezoelectric layer, at least one of the first electrode and the second electrode comprising a first conductive layer disposed adjacent to the piezoelectric layer and having a first acoustic impedance, and a second conductive layer disposed on a side of the first conductive layer opposite the piezoelectric layer and having a second acoustic impedance greater than the first acoustic impedance; and
   at least one lateral feature for increasing quality factor Q of the acoustic resonator device, the at least one lateral feature comprising at least one of:
      an air-ring between the piezoelectric layer and the second electrode; and
      a frame on at least one of the first electrode and the piezoelectric layer.

2. The acoustic resonator device of claim 1, wherein the air-ring defines an outside boundary of a main membrane region of the acoustic resonator device.

3. The acoustic resonator device of claim 2, wherein the frame has an inner edge defining a boundary of an active region formed within the main membrane region of the acoustic resonator device.

4. The acoustic resonator device of claim 3, further comprising a substrate, wherein the first electrode is disposed between the substrate and the piezoelectric layer.

5. The acoustic resonator device of claim 3, wherein each of the first electrode and the second electrode comprises a first conductive layer disposed adjacent to the piezoelectric layer and having the first acoustic impedance, and the second conductive layer disposed on the side of the first conductive layer opposite the piezoelectric layer and having the second acoustic impedance.

6. The acoustic resonator device of claim 5, wherein the first conductive layer is formed of a first material, and the second conductive layer is formed of a second material.

7. The acoustic resonator device of claim 6, wherein the first material is one of molybdenum, niobium, or an alloy of niobium and molybdenum, and the second material is one of tungsten or iridium.

8. The acoustic resonator device of claim 1, wherein the piezoelectric layer comprises aluminum scandium nitride having less than about 10 percent scandium replacing aluminum in standard aluminum nitride (AlN).

9. An acoustic resonator device, comprising:
   a bottom electrode disposed over a substrate on an acoustic reflecting feature;
   a piezoelectric layer disposed on the bottom electrode;
   a top electrode disposed on the piezoelectric layer;
   an air-ring formed between the piezoelectric layer and the top electrode, the air-ring defining an outside boundary of a main membrane region; and
   a first frame formed between the piezoelectric layer and the top electrode,
   wherein at least one of the bottom electrode and the top electrode comprises a first conductive layer disposed adjacent to the piezoelectric layer and having a first acoustic impedance, and a second conductive layer disposed adjacent the first conductive layer and having a second acoustic impedance greater than the first acoustic impedance.

10. The acoustic resonator device of claim 9, wherein the first frame has an inner edge defining a boundary of an active region formed within the main membrane region.

11. The acoustic resonator device of claim 9, wherein the at least one of the bottom electrode and the top electrode further comprises a third conductive layer disposed adjacent the second conductive layer.

12. The acoustic resonator device of claim 11, wherein the third conductive layer has a third acoustic impedance greater than the first acoustic impedance.

13. The acoustic resonator device of claim 11, wherein the third conductive layer has a third acoustic impedance less than the first acoustic impedance.

14. The acoustic resonator device of claim 11, wherein the third conductive layer has a third acoustic impedance the same as the first acoustic impedance.

15. The acoustic resonator device of claim 9, wherein the acoustic reflecting feature comprises an air cavity formed in the substrate.

16. The acoustic resonator device of claim 9, wherein the acoustic reflecting feature comprises a distributed Bragg reflector formed between the substrate and the bottom electrode.

17. The acoustic resonator device of claim 9, further comprising:

a second frame formed between the bottom electrode and the piezoelectric layer, or formed between the substrate and the bottom electrode.

18. The acoustic resonator device of claim 17, wherein the second frame has an inner edge defining a boundary of an active region formed within the main membrane region, the inner edge of the second frame extending further into the main membrane region than an inner edge of the first frame.

19. The acoustic resonator device of claim 17, wherein the first frame has an inner edge defining a boundary of an active region formed within the main membrane region, the inner edge of the first frame extending further into the main membrane region than an inner edge of the second frame.

20. An bulk acoustic wave (BAW) resonator, comprising:
a substrate;
a bottom electrode disposed over the substrate on an acoustic reflecting feature;
a piezoelectric layer disposed on the bottom electrode;
a top electrode disposed on the piezoelectric layer;
an air-ring defining an outside boundary of a main membrane region; and
a frame formed on at least one of the piezoelectric layer, the bottom electrode and the substrate,
wherein at least one of the bottom electrode and the top electrode comprises a plurality of conductive layers having different acoustic impedances, respectively, the lowest acoustic impedance being adjacent to the piezoelectric layer; and wherein the acoustic reflecting feature is one of an air-cavity or an acoustic mirror.

* * * * *